United States Patent
Gutsche et al.

(10) Patent No.: US 7,312,115 B2
(45) Date of Patent: Dec. 25, 2007

(54) FABRICATION METHOD FOR A SEMICONDUCTOR STRUCTURE HAVING INTEGRATED CAPACITORS

(75) Inventors: Martin Gutsche, Dorfen (DE); Harald Seidl, Poring (DE)

(73) Assignee: Infineon Technologies AG, Munich (DE)

( * ) Notice: Subject to any disclaimer, the term of this patent is extended or adjusted under 35 U.S.C. 154(b) by 306 days.

(21) Appl. No.: 11/127,505

(22) Filed: May 12, 2005

(65) Prior Publication Data

US 2006/0001067 A1    Jan. 5, 2006

(30) Foreign Application Priority Data

May 13, 2004   (DE)   ............. 10 2004 023 805

(51) Int. Cl.
*H01L 21/8242* (2006.01)
(52) U.S. Cl. .............. 438/243; 438/244; 438/386; 438/387; 257/E29.346
(58) Field of Classification Search ........... 438/243, 438/244, 386, 387
See application file for complete search history.

(56) References Cited

U.S. PATENT DOCUMENTS

| | | | |
|---|---|---|---|
| 5,521,115 A * | 5/1996 | Park et al. | ............. 438/243 |
| 6,603,164 B2 | 8/2003 | Kastner et al. | |
| 6,724,030 B2 | 4/2004 | Hummler | |
| 7,223,697 B2 * | 5/2007 | Brooks et al. | ............. 438/692 |
| 2002/0137278 A1 * | 9/2002 | Temmler et al. | ............. 438/243 |
| 2004/0245558 A1 * | 12/2004 | Manger | .............. 257/301 |

FOREIGN PATENT DOCUMENTS

| | | |
|---|---|---|
| DE | 10065664 | 7/2002 |
| DE | 10301936 | 9/2003 |
| JP | 62072171 | 4/1987 |

OTHER PUBLICATIONS

German Office Action dated Jan. 13, 2005.

* cited by examiner

*Primary Examiner*—Thanh Nguyen
(74) *Attorney, Agent, or Firm*—Jenkins, Wilson, Taylor & Hunt, P.A.

(57) ABSTRACT

The present invention provides a fabrication method for a semiconductor structure having integrated capacitors and a corresponding semiconductor structure. The fabrication method has the following steps of: providing a semiconductor substrate (1; 1', 60, 1") having a front side (VS) and a rear side (RS); providing trenches (5) in the semiconductor substrate (1; 1', 60, 1") proceeding from the front side (VS) of the semiconductor substrate (1; 1', 60, 1"); providing a respective inner capacitor electrode (6) in the trenches (5); uncovering the inner capacitor electrodes (6) proceeding from the rear side (RS) of the semiconductor substrate (1; 1', 60, 1"); providing a capacitor dielectric (40) on the uncovered inner capacitor electrodes (6); and providing outer capacitor electrodes (50) on the capacitor dielectric (40) on the inner capacitor electrodes (6).

10 Claims, 30 Drawing Sheets

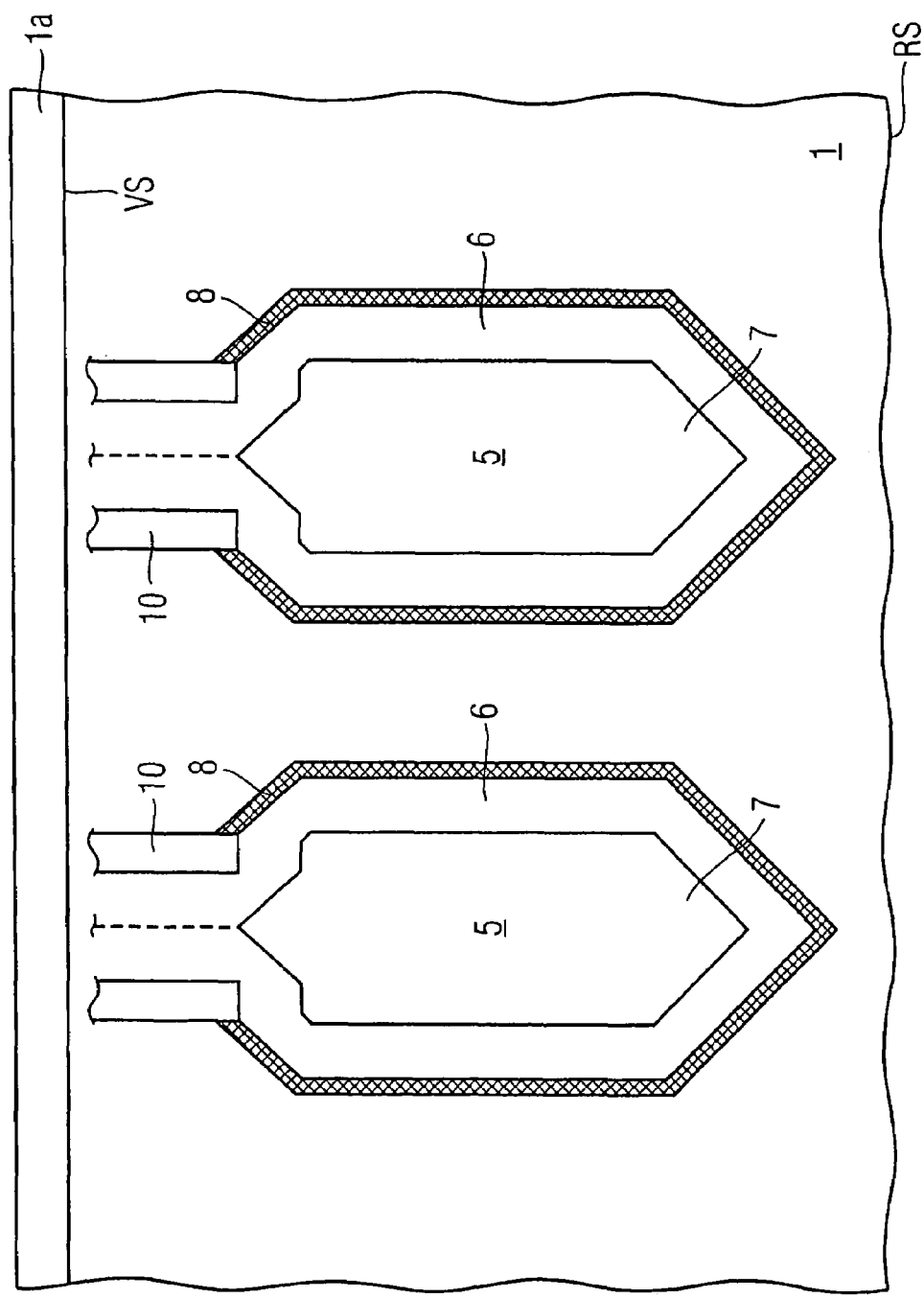

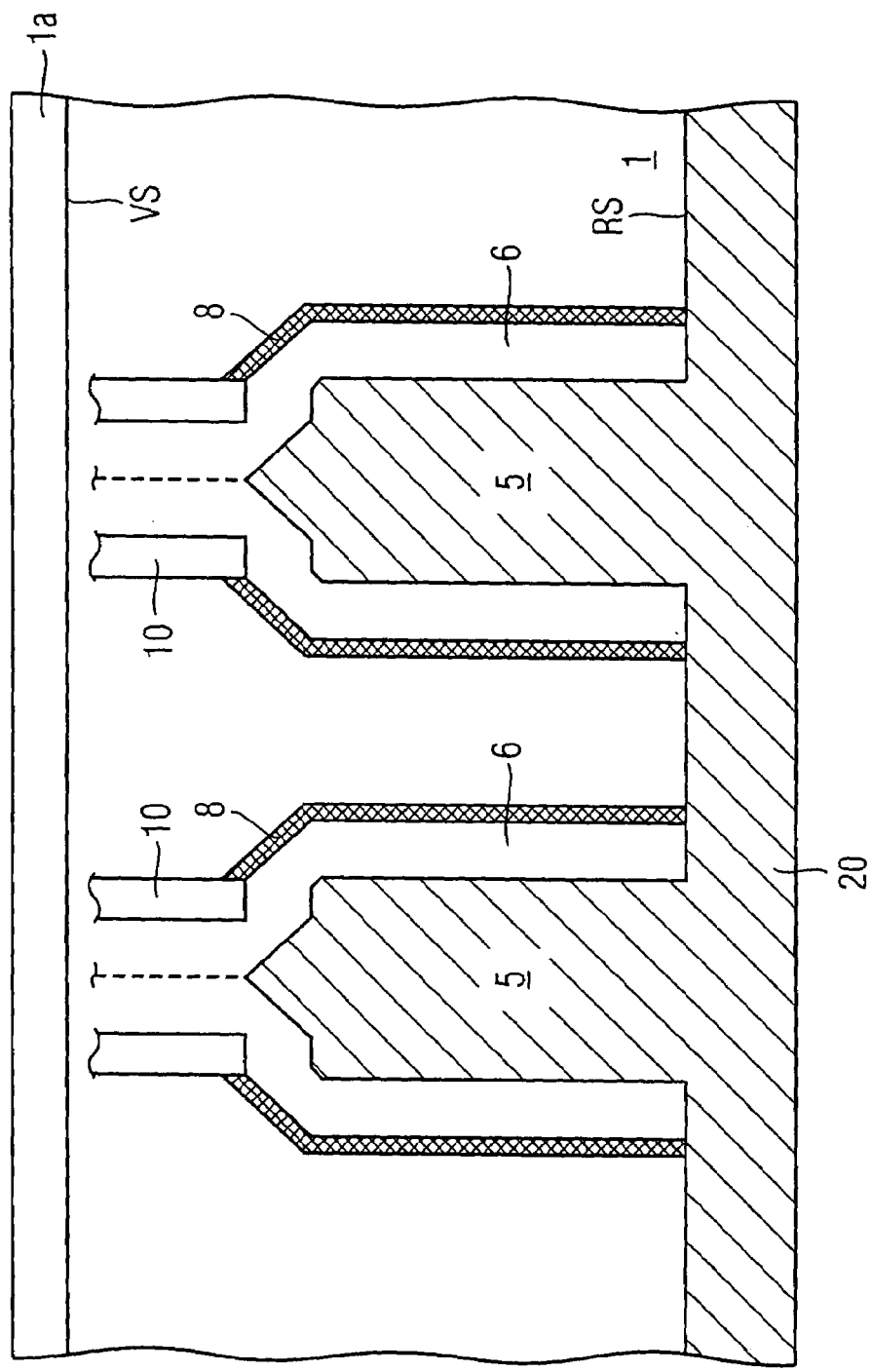

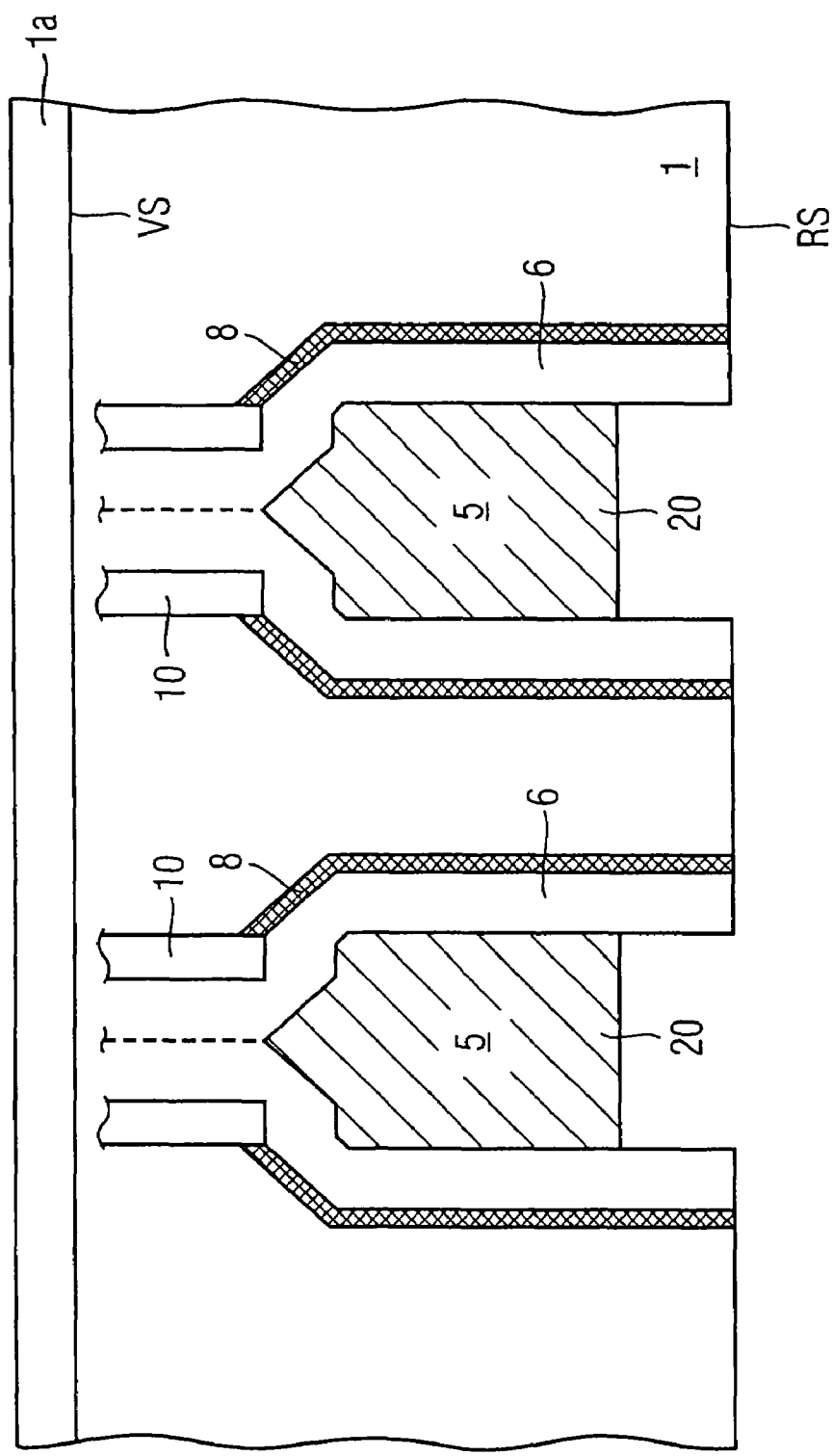

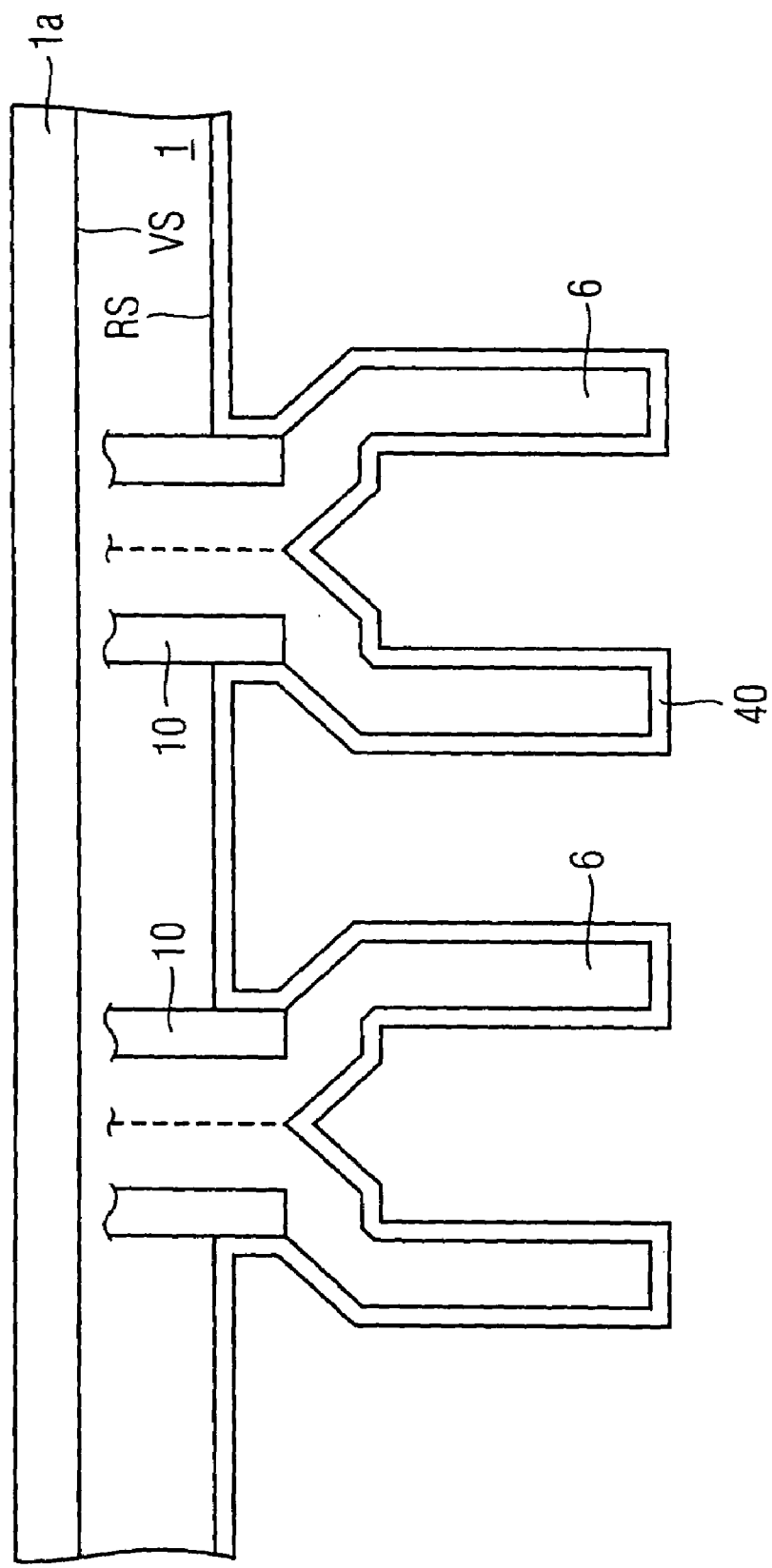

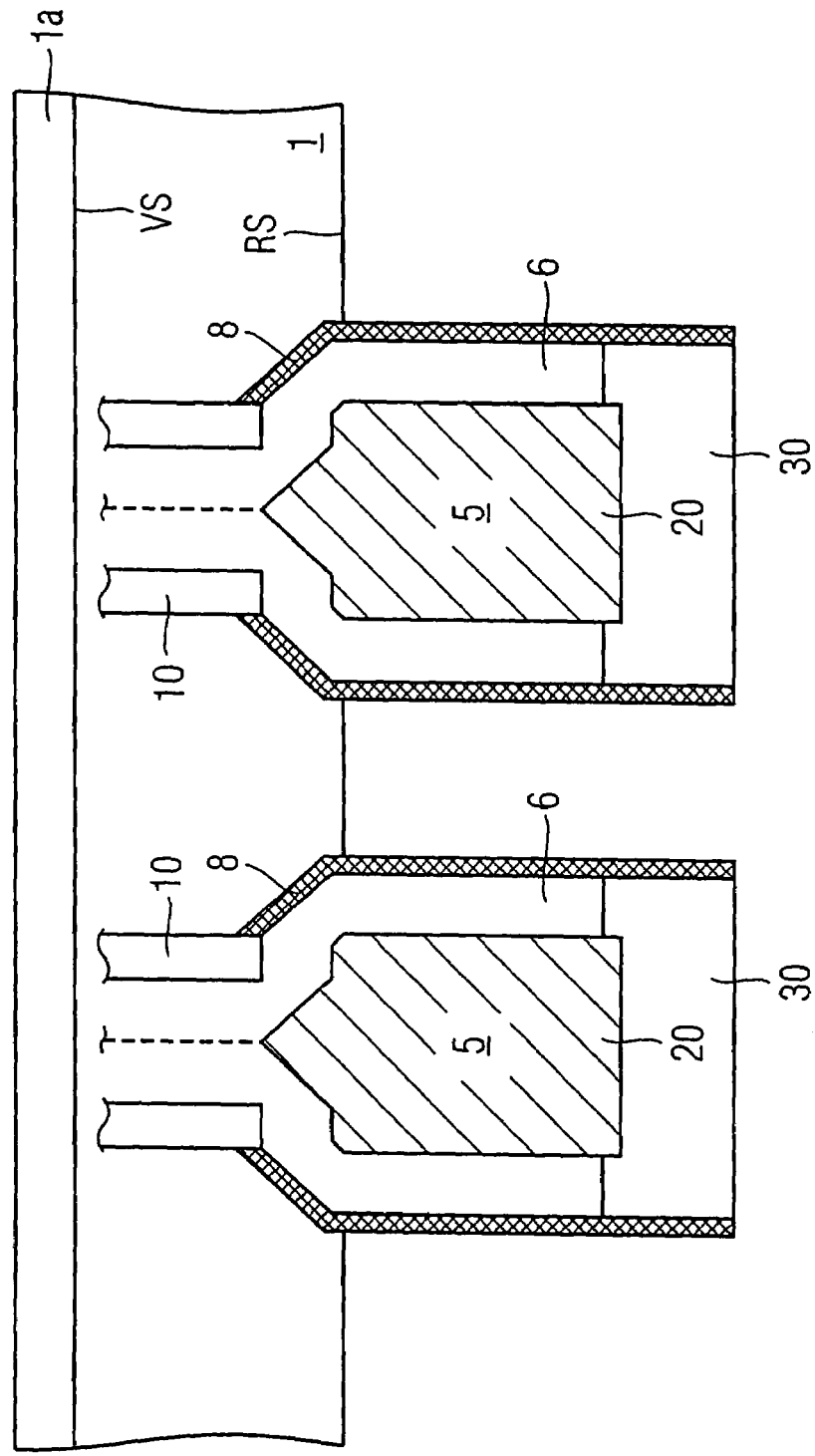

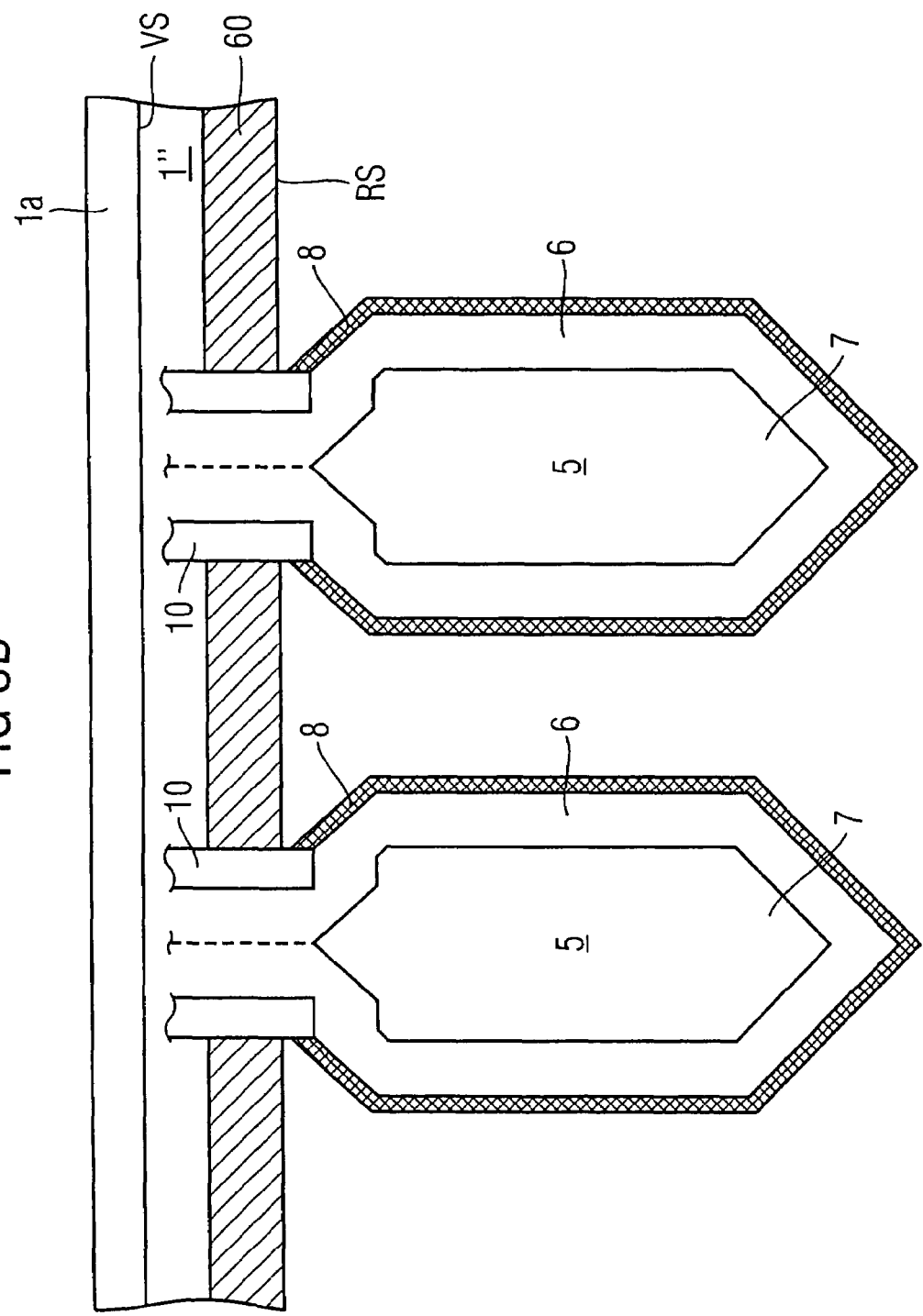

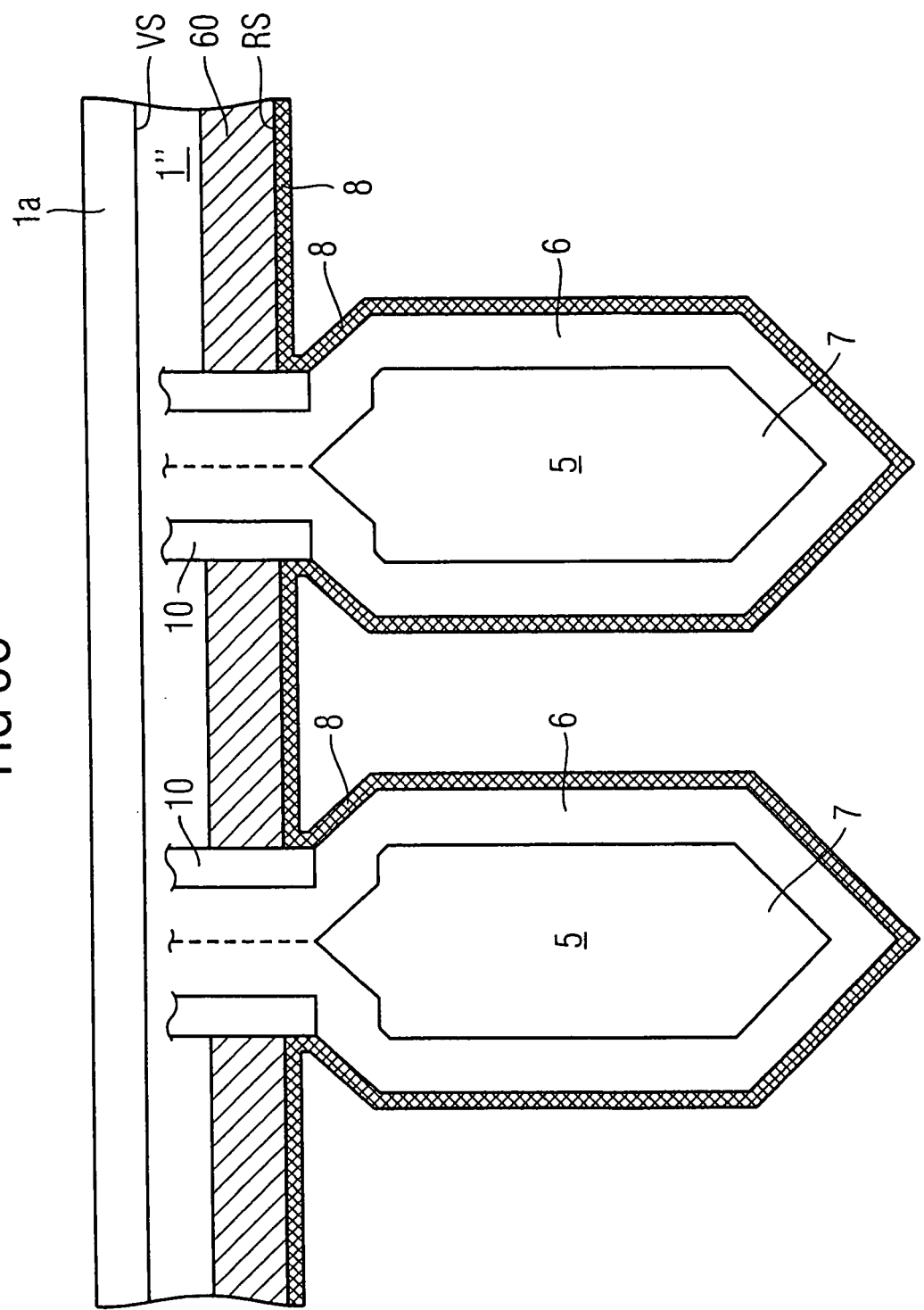

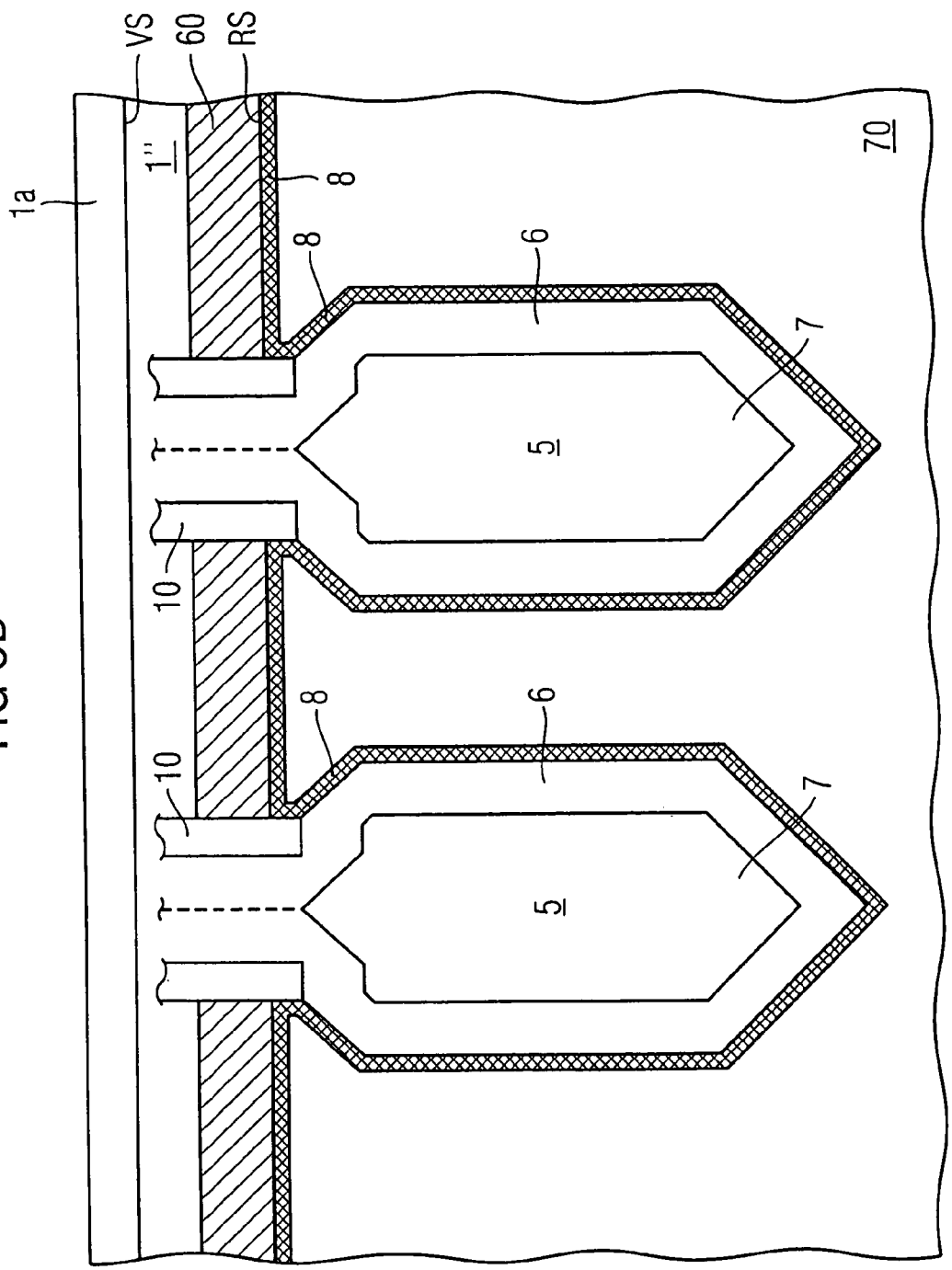

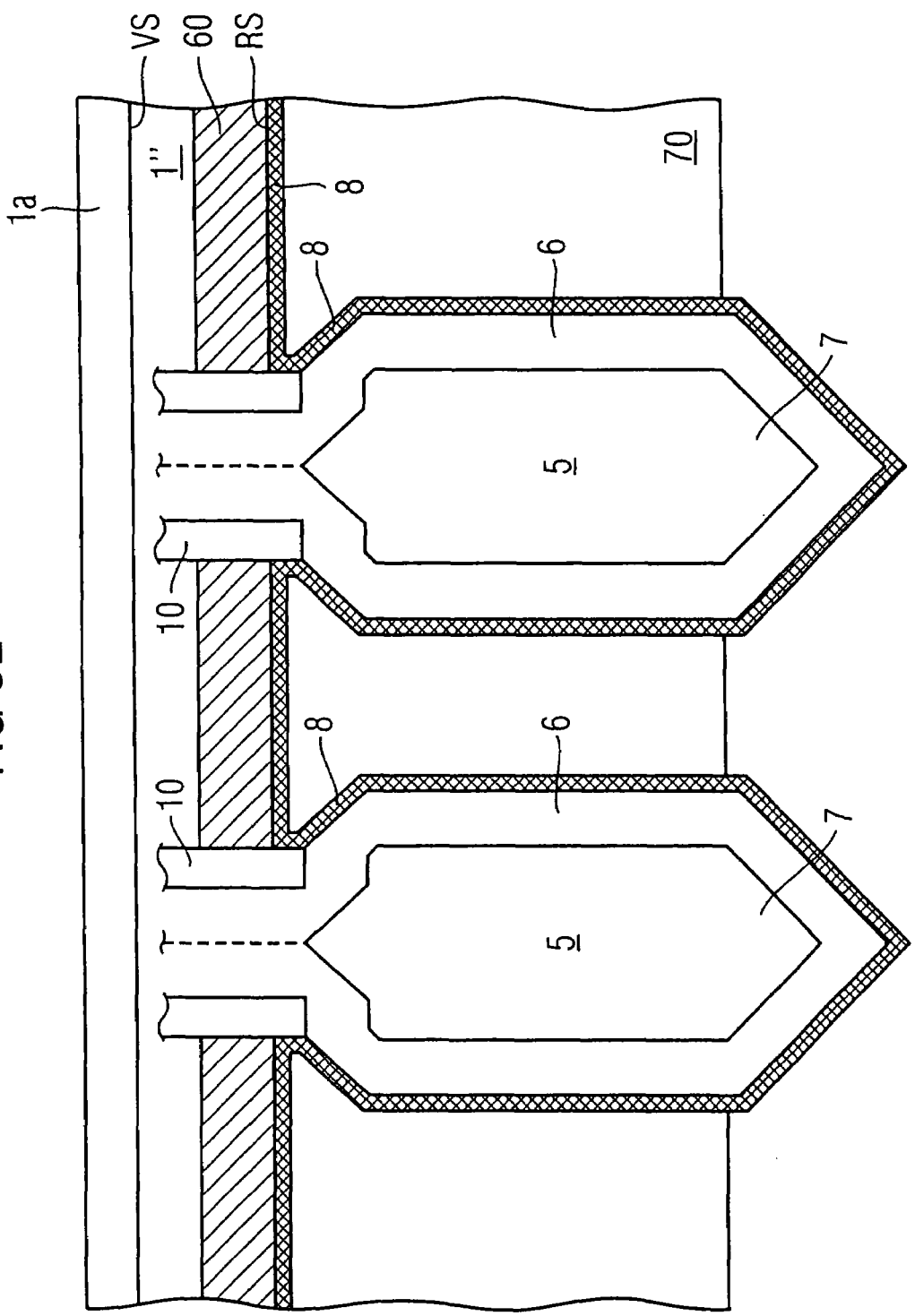

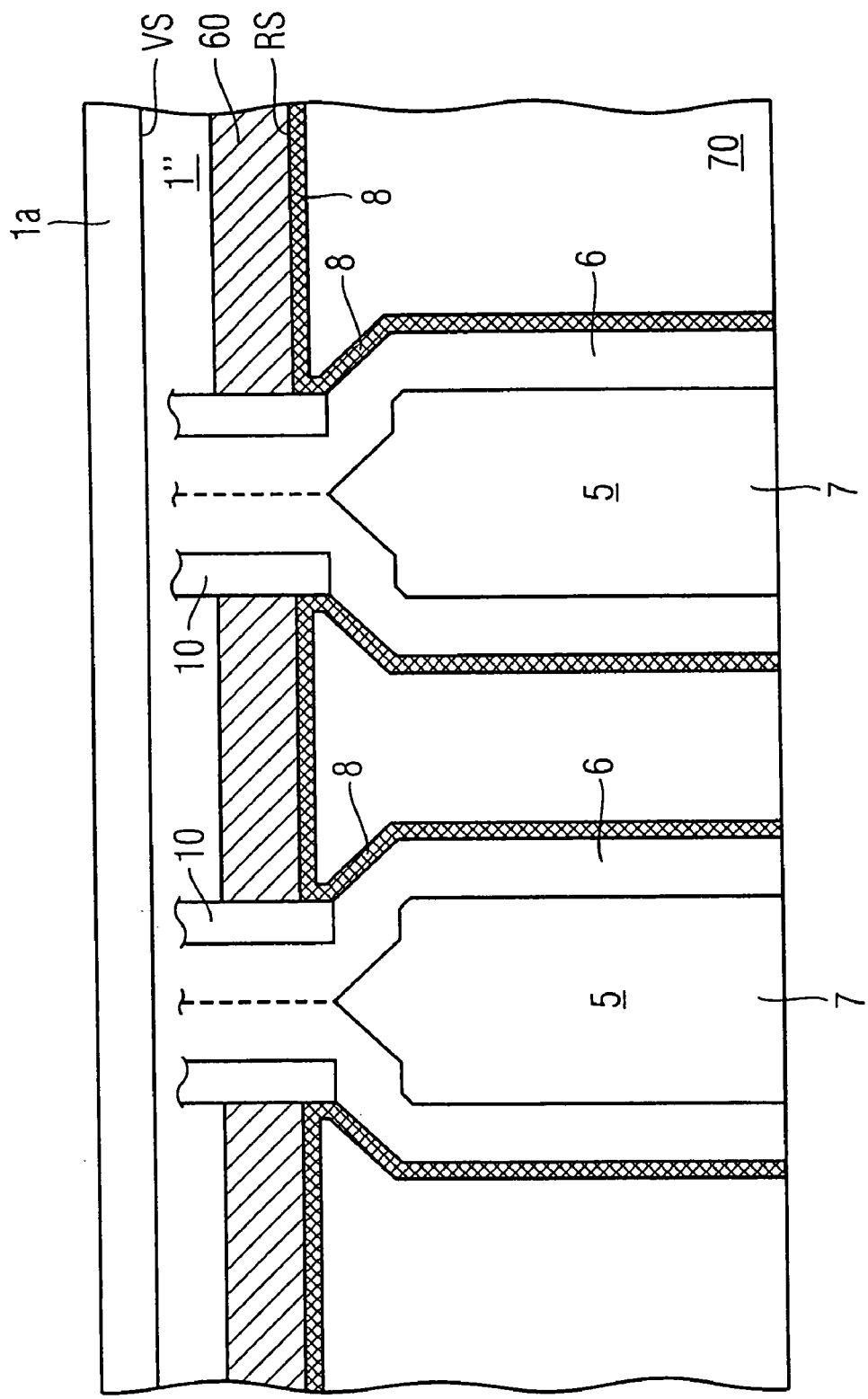

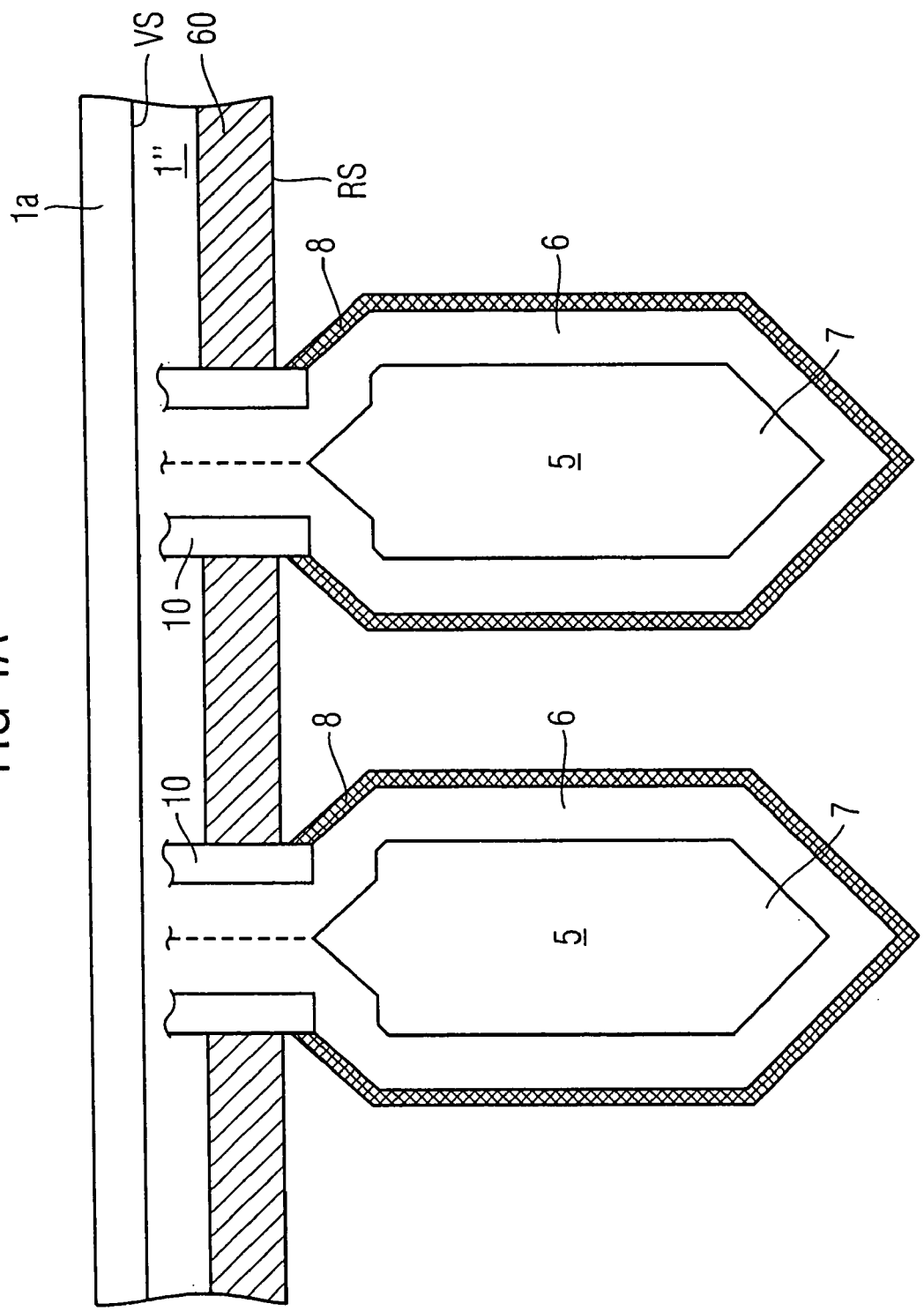

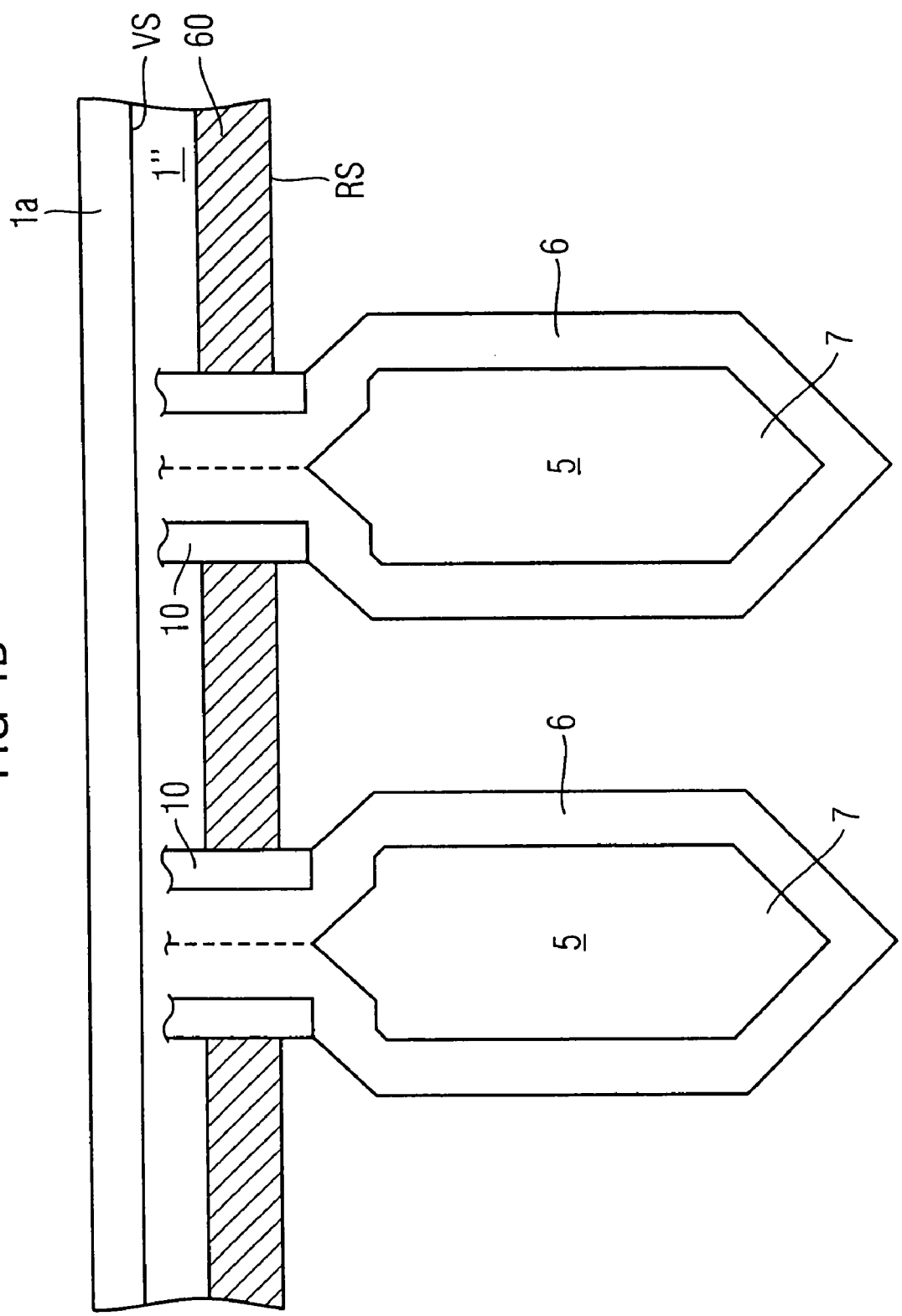

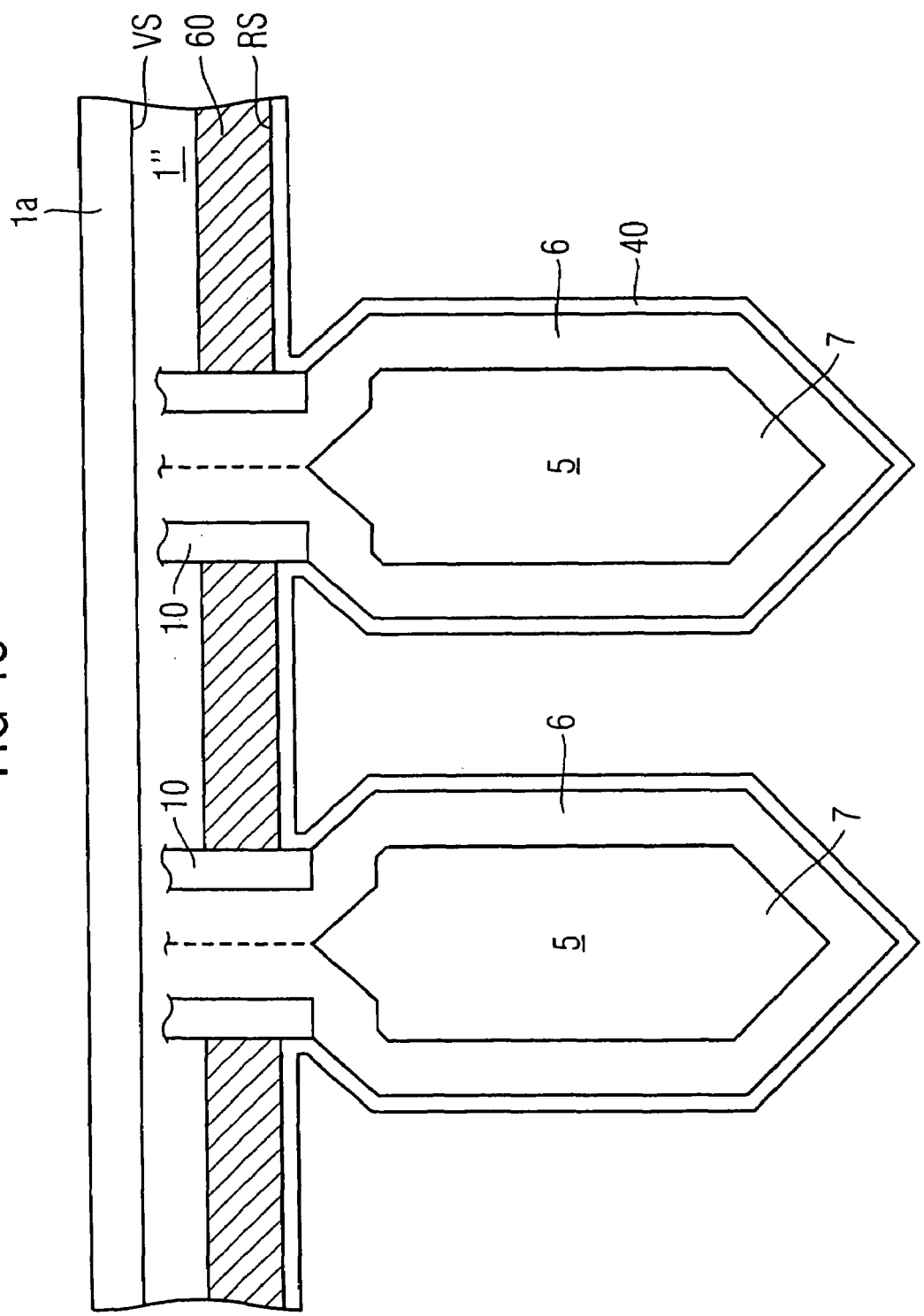

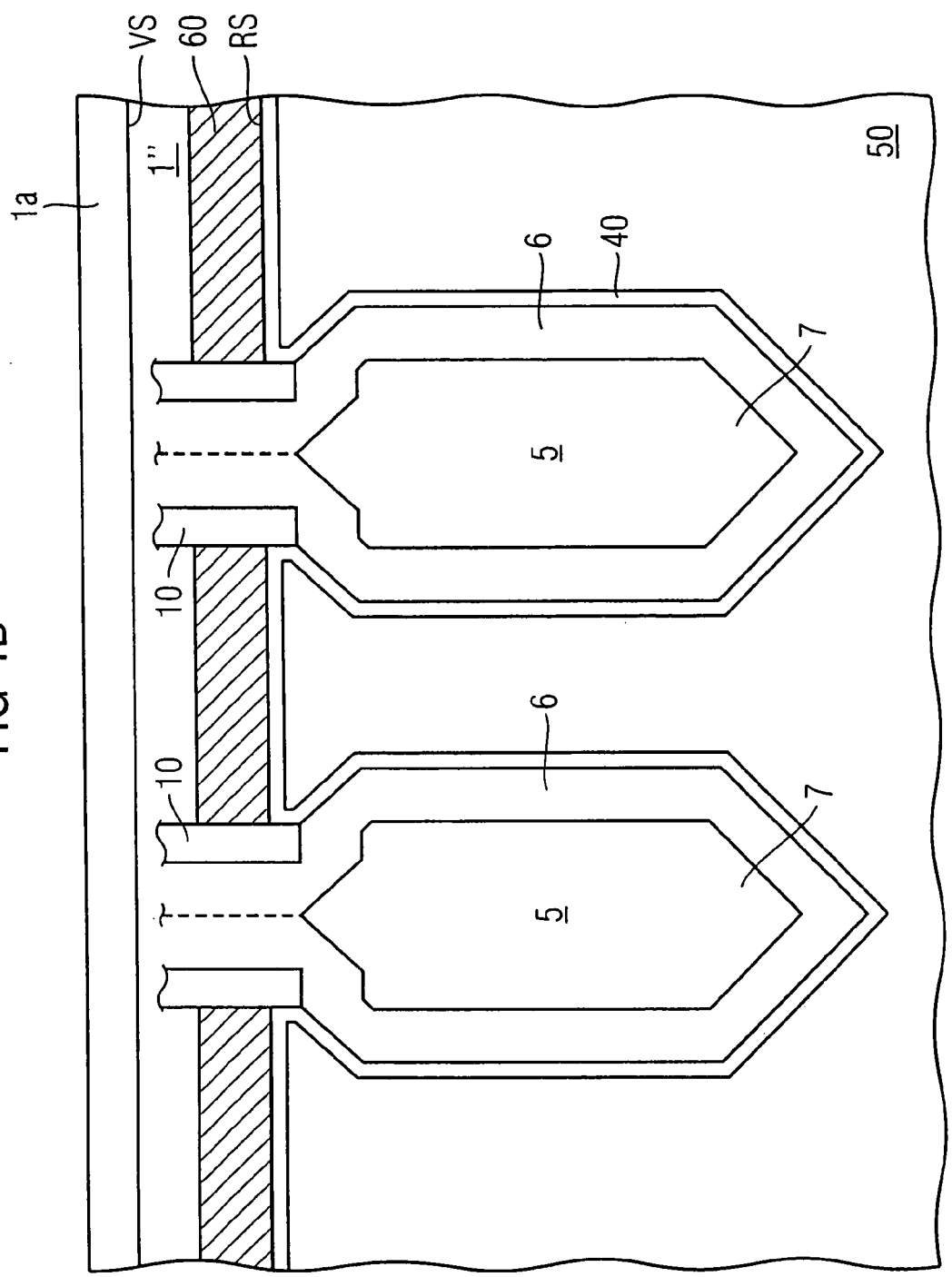

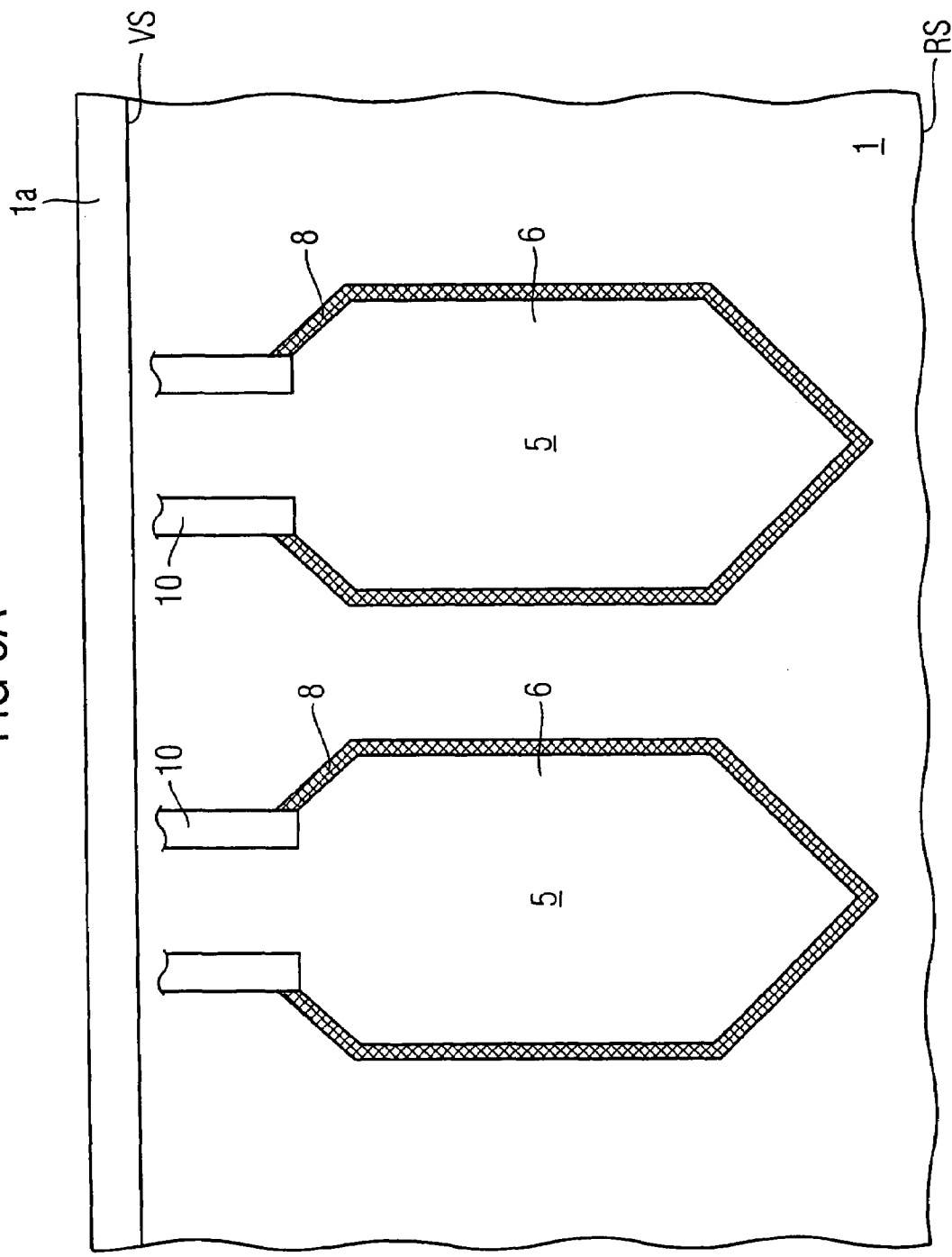

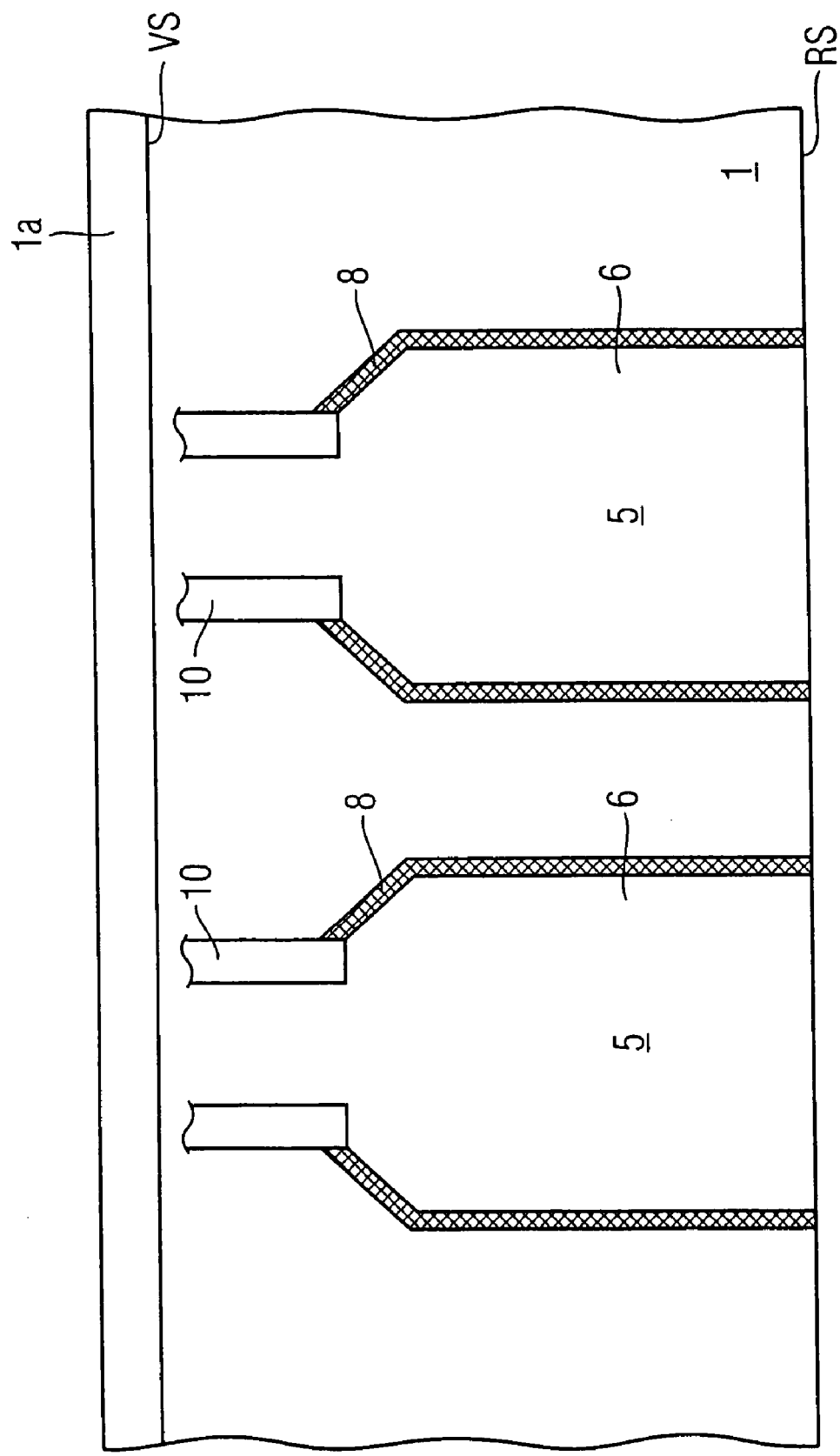

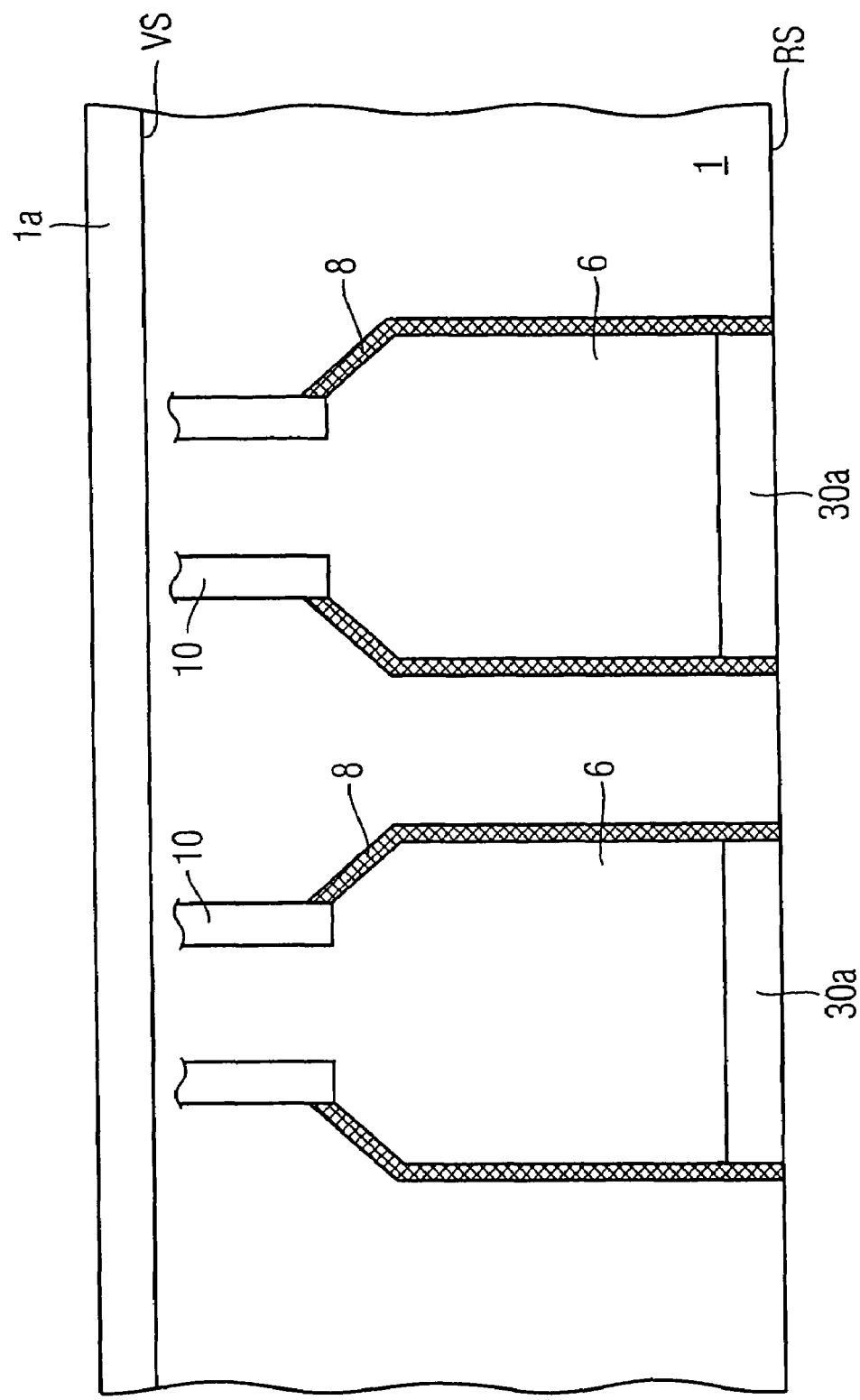

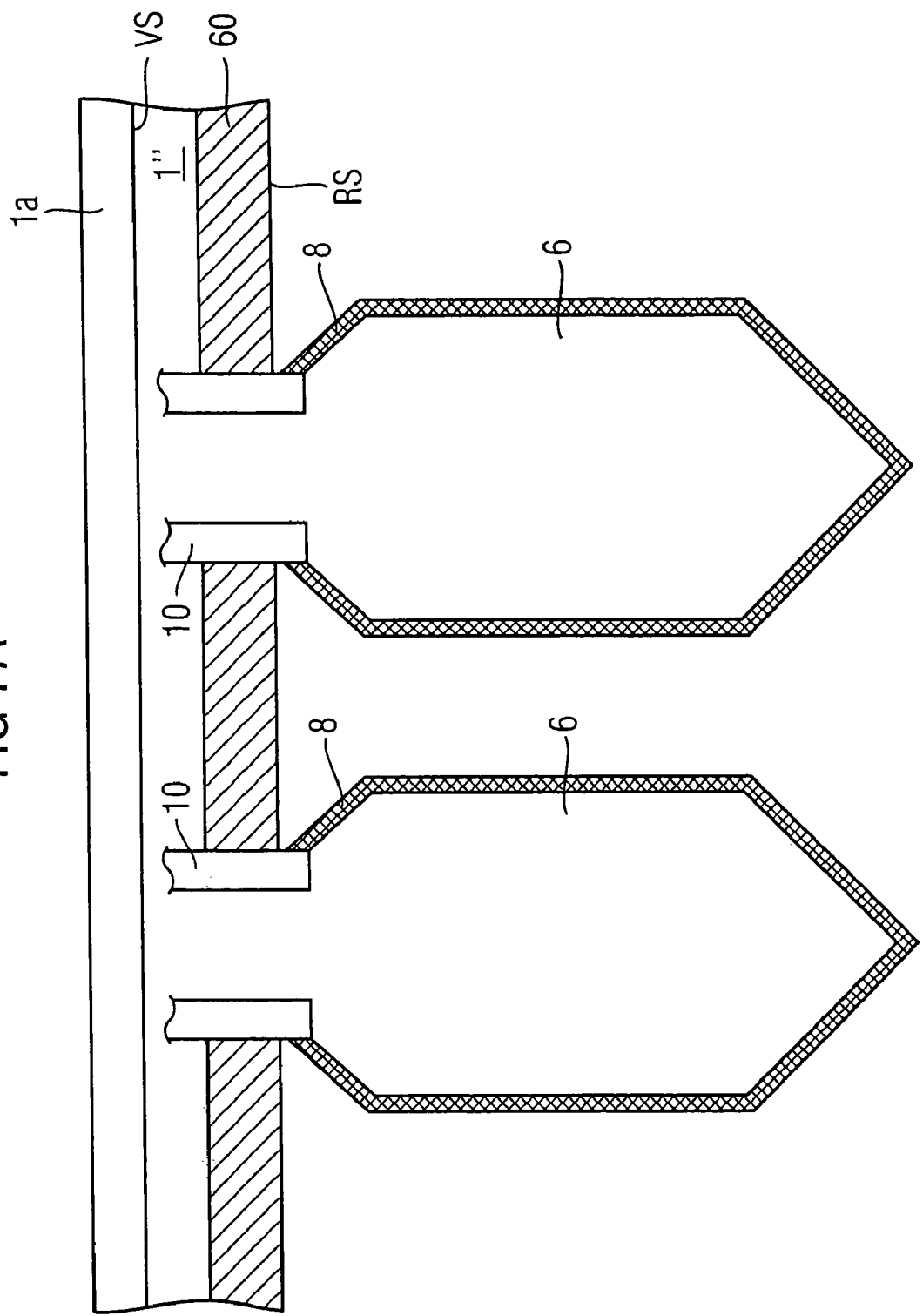

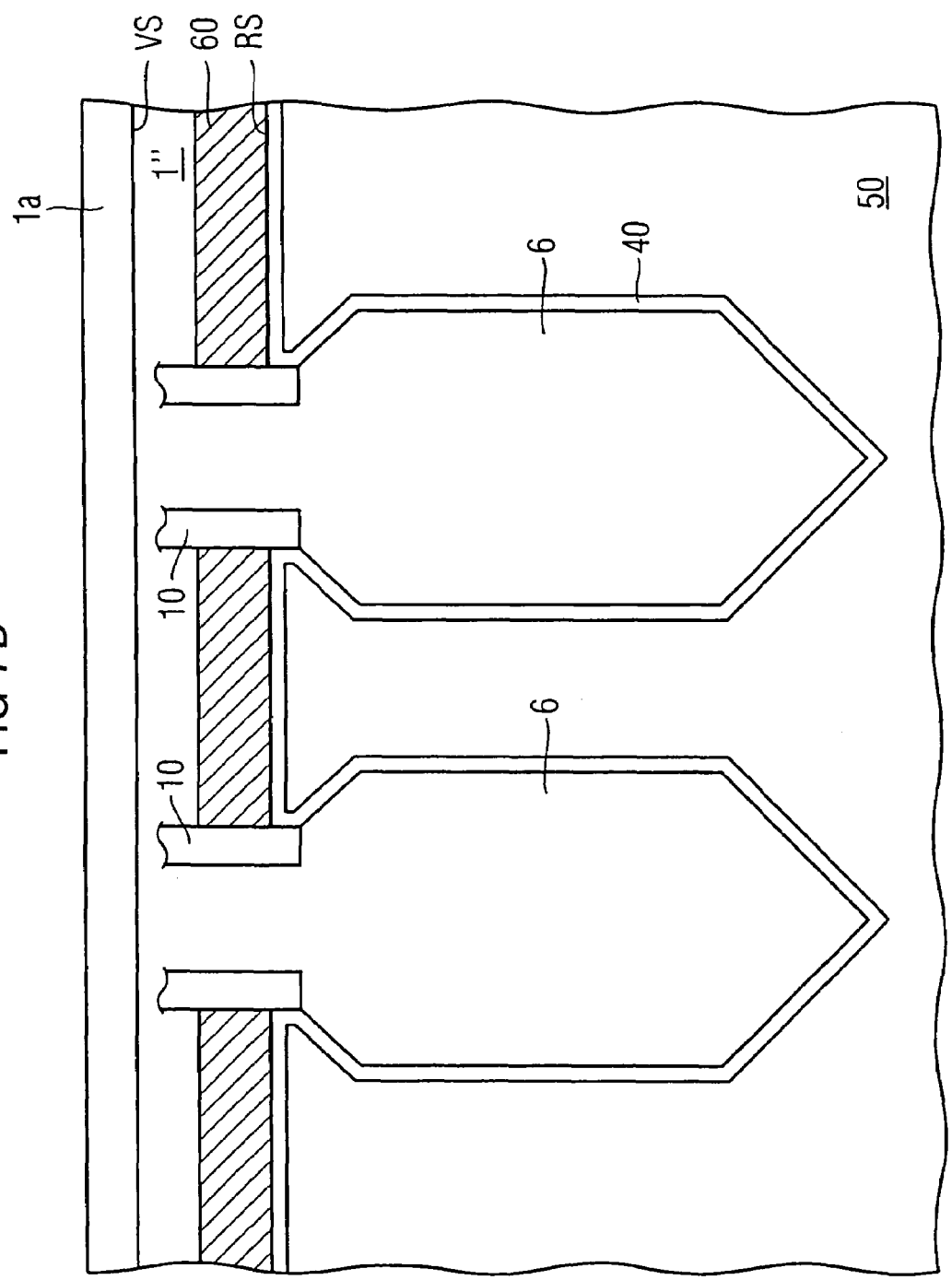

FABRICATION METHOD FOR A SEMICONDUCTOR STRUCTURE HAVING INTEGRATED CAPACITORS

TECHNICAL FIELD

The present invention relates to a fabrication method for a semiconductor structure having integrated capacitors and a corresponding semiconductor structure.

BACKGROUND ART

Although applicable in principle to arbitrary integrated circuits, the present invention and also the problem area on which it is based will be explained with regard to integrated memory circuits using silicon technology.

SUMMARY OF THE INVENTION

Nowadays, large scale integrated memory circuits use either trench capacitors or stacked capacitors for storing the bit information.

Trench capacitors expose the capacitor layers to an enormously high thermal budget since the trench is produced before the associated selection transistor and, consequently, the capacitor "sees" the process steps for transistor fabrication. In the normal case, trench capacitor concepts also do not permit a crownlike structure of the capacitor, as a result of which electrode area is lost and capacitance is consequently forfeited.

Therefore, it is an object of the present invention to provide a fabrication method for a semiconductor structure having integrated capacitors and a corresponding semiconductor structure, in which case the high degree of integration of trench capacitors can be achieved and the capacitor dielectric can nevertheless be exposed to a lower thermal budget.

According to the invention, this problem is solved by means of the fabrication method specified in Claim 1.

The present invention provides a capacitor concept whose process sequence may be configured in such a way that the capacitor can be created at the very end of the overall process sequence, that is to say e.g. after transistor fabrication or the like. As a result, it is possible to realize substantially lower thermal loading on the capacitor, namely the dielectric layer and the electrodes. Moreover, given the same aspect ratio, substantially larger capacitor surface areas (crown structures) may be made possible, which makes higher capacitance values possible.

In the case of the method according to the invention, it is possible to keep the rear side of the substrate below a temperature of approximately 400° C. if corresponding deposition processes are chosen. Therefore, ALD (atomic layer deposition) processes, in particular, are taken into consideration. The low process temperature enables an amorphous dielectric layer for the capacitor dielectric with good leakage current properties. An undesirable crystallization of the capacitor layers can be avoided with such process implementation.

Advantageous developments and improvements of the respective subject matter of the invention are found in the subclaims.

In accordance with one preferred development, the inner capacitor electrodes cover the respective trench on the trench walls and leave a cavity in the trench.

In accordance with a further preferred development, the following steps are performed for uncovering the inner capacitor electrodes:
providing an etching stop layer on the trench walls under the inner capacitor electrodes;
removing the semiconductor substrate, the etching stop layer and the inner capacitor electrodes on the rear side for the purpose of opening the cavity;
providing a first filling layer in the cavity;
sinking the first filling layer and the respective inner capacitor electrode in the cavity;
providing a second filling layer on the rear side, which plugs the trenches;
removing the second filling layer for the purpose of uncovering the semiconductor substrate on the rear side between the trenches;
selectively removing the semiconductor substrate on the rear side as far as the upper trench region with respect to the etching stop layer and the second filling layer; and
removing the etching stop layer and the first and second filling layers.

In accordance with a further preferred development, the semiconductor substrate has a rear-side first substrate layer, a front-side second substrate layer and a middle insulation layer, the middle insulation layer functioning as an etching stop in the course of uncovering the inner capacitor electrodes.

In accordance with a further preferred development, the inner capacitor electrodes fill the respective trench.

In accordance with a further preferred development, the following steps are performed for uncovering the inner capacitor electrodes:
providing an etching stop layer on the trench walls under the inner capacitor electrodes;
selectively removing the semiconductor substrate on the rear side as far as the upper trench region with respect to the etching stop layer;
providing a third filling layer for embedding the trenches;
removing the third filling layer, the etching stop layer and the inner capacitor electrodes on the rear side for the purpose of opening the cavity; and
removing the third filling layer and the etching stop layer.

In accordance with a further preferred development, the following steps are performed for uncovering the inner capacitor electrodes:
providing an etching stop layer on the trench walls under the inner capacitor electrodes;
selectively removing the semiconductor substrate on the rear side as far as the upper trench region with respect to the etching stop layer; and
removing the etching stop layer.

In accordance with a further preferred development, the following steps are performed for uncovering the inner capacitor electrodes:
providing an etching stop layer on the trench walls under the inner capacitor electrodes;
removing the semiconductor substrate, the etching stop layer and the inner capacitor electrodes on the rear side for the purpose of opening the filled trenches;
sinking the inner capacitor electrodes;
providing a fourth filling layer on the rear side, which plugs the trenches;
selectively removing the semiconductor substrate on the rear side as far as the upper trench region with respect to the etching stop layer; and
removing the etching stop layer.

In accordance with a further preferred development, the trenches are widened in bottle-shaped fashion in the lower trench region.

In accordance with a further preferred development, the outer capacitor electrodes are provided from a whole-area conductive layer on the rear side.

Exemplary embodiments of the invention are illustrated in the drawings and are explained in more detail in the description below.

BRIEF DESCRIPTION OF THE DRAWINGS

FIGS. 1A-K show schematic illustrations of successive method stages of a fabrication method for a semiconductor structure as a first embodiment of the present invention;

FIG. 2 shows a schematic illustration of a method stage of a fabrication method for a semiconductor structure as a second embodiment of the present invention;

FIGS. 3A-F show schematic illustrations of successive method stages of a fabrication method for a semiconductor structure as a third embodiment of the present invention;

FIGS. 4A-D show schematic illustrations of successive method stages of a fabrication method for a semiconductor structure as a fourth embodiment of the present invention;

FIGS. 6A-D show schematic illustrations of successive method stages of a fabrication method for a semiconductor structure as a sixth embodiment of the present invention; and FIGS. 7A, B show schematic illustrations of successive method stages of a fabrication method for a semiconductor structure as a seventh embodiment of the present invention.

DETAILED DESCRIPTION OF THE INVENTION

Figure 1B:
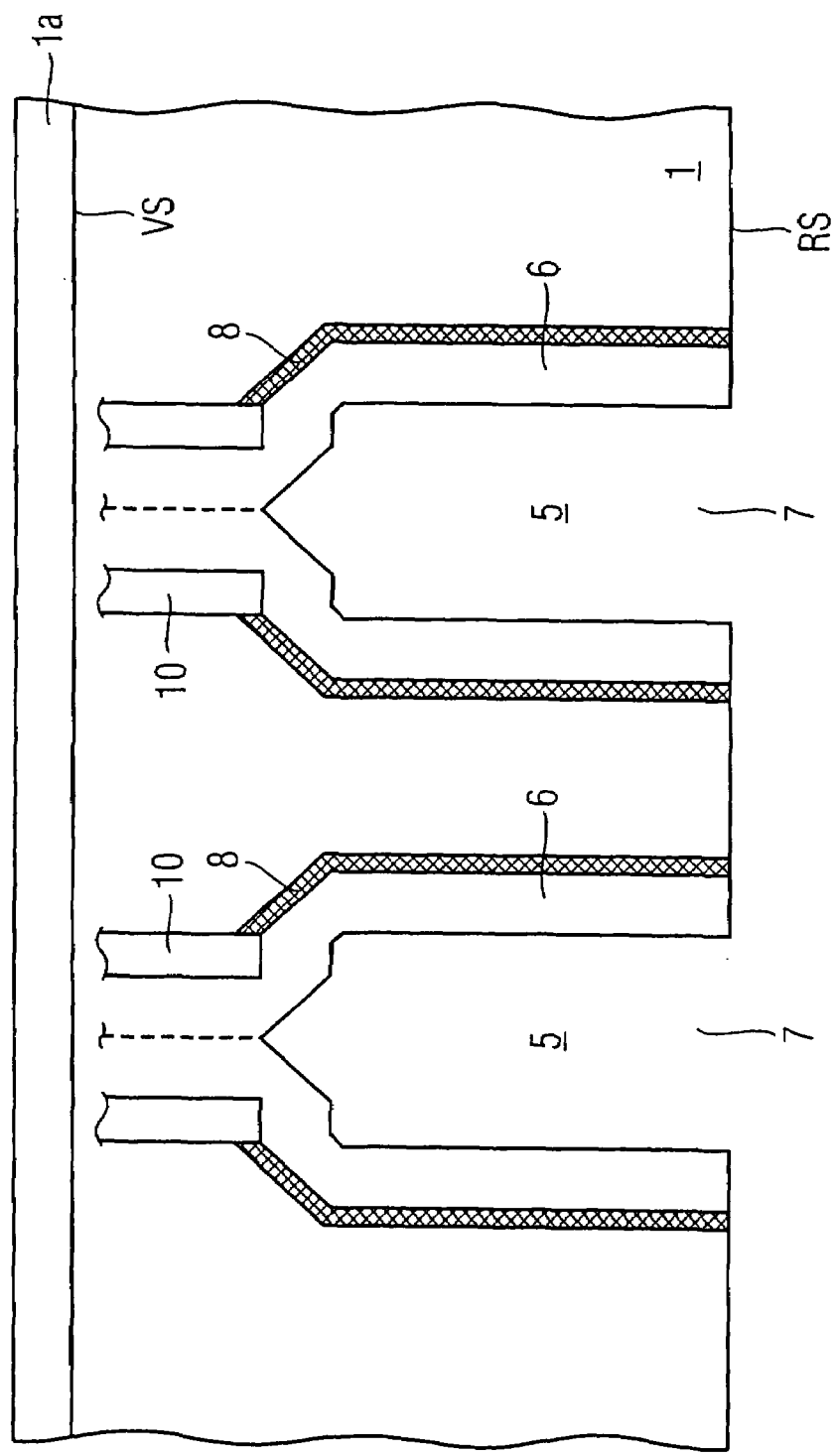

In the figures, identical reference symbols designate identical or functionally identical constituent parts.

FIGS. 1A-K show schematic illustrations of successive method stages of a fabrication method for a semiconductor structure as a first embodiment of the present invention.

In FIG. 1A, reference 1 designates a silicon semiconductor substrate having a front side VS and a rear side RS. The front side VS of the semiconductor substrate 1 is connected to a carrier substrate 1A, for example a carrier wafer.

Trenches 5 are provided in the semiconductor substrate 1, said trenches being widened in bottle-shaped fashion in the lower trench region. The trenches have an insulation collar 10 in the upper trench region. An etching stop layer 8, for example made of $Al_2O_3$ or $Si_3N_4$, is provided on the trench walls in the interior of the trenches 5. Furthermore, a respective inner capacitor electrode 6, for example made of polysilicon or a metal, is situated in the interior of the trenches 5 on the etching stop layer 8 and leaves a cavity 7 free in the trench.

For reasons of clarity, that part of the integrated circuit which is situated on the front side VS of the semiconductor substrate 1, that is the selection transistors, etc., is not illustrated.

The fabrication of a structure in accordance with FIG. 1A can be realized by means of customary semiconductor processes and is therefore not explained in any greater detail.

Referring further to FIG. 1B, the semiconductor substrate 1 is then etched back on the rear side RS by means of a customary silicon etching and the underside of the trenches 5 is opened by means of a CMP process, wet etching process or dry etching process, the etching stop layer 8 and the inner capacitor electrode 6 being partially removed. Consequently, the cavity 7 in the trench 5 is uncovered toward the rear side RS.

In a subsequent process step illustrated in FIG. 1C, a first filling layer 20, e.g. made of silicon oxide or silicate glass or low-k material such as e.g. Silk, is then provided on the rear side in order to completely fill the trenches 5.

Afterward, referring to FIG. 1D, the first filling layer 20 is sunk into the trenches 5.

Figure 1E:
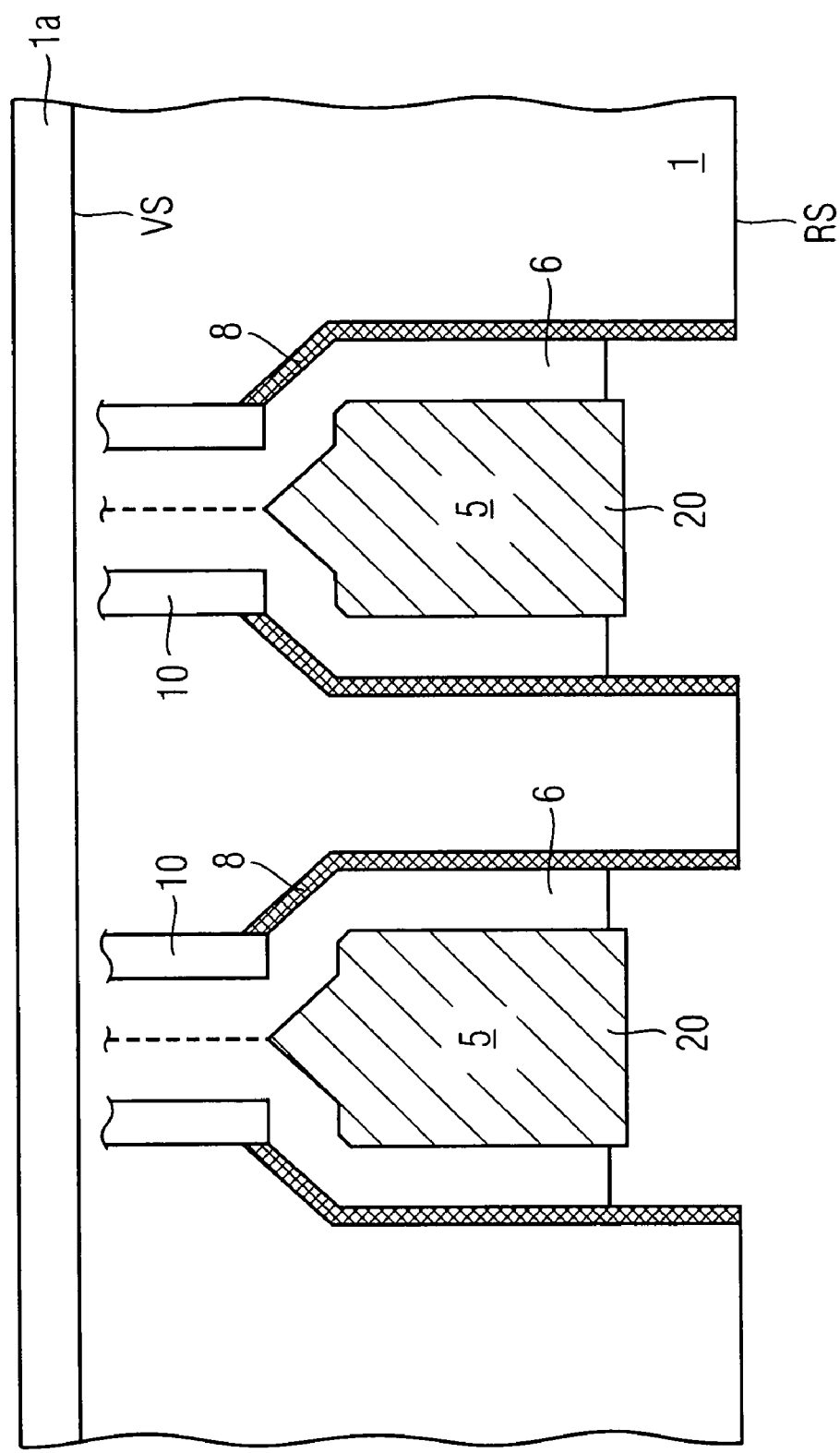

As illustrated in FIG. 1E, the respective inner capacitor electrode 6 is then likewise pulled back into the trench 5. If the inner capacitor electrodes 6 are composed of polysilicon, then during this pull-back the semiconductor substrate 1 is also pulled back slightly on the rear side RS, but this does not disturb the subsequent course of the process.

Figure 1F:
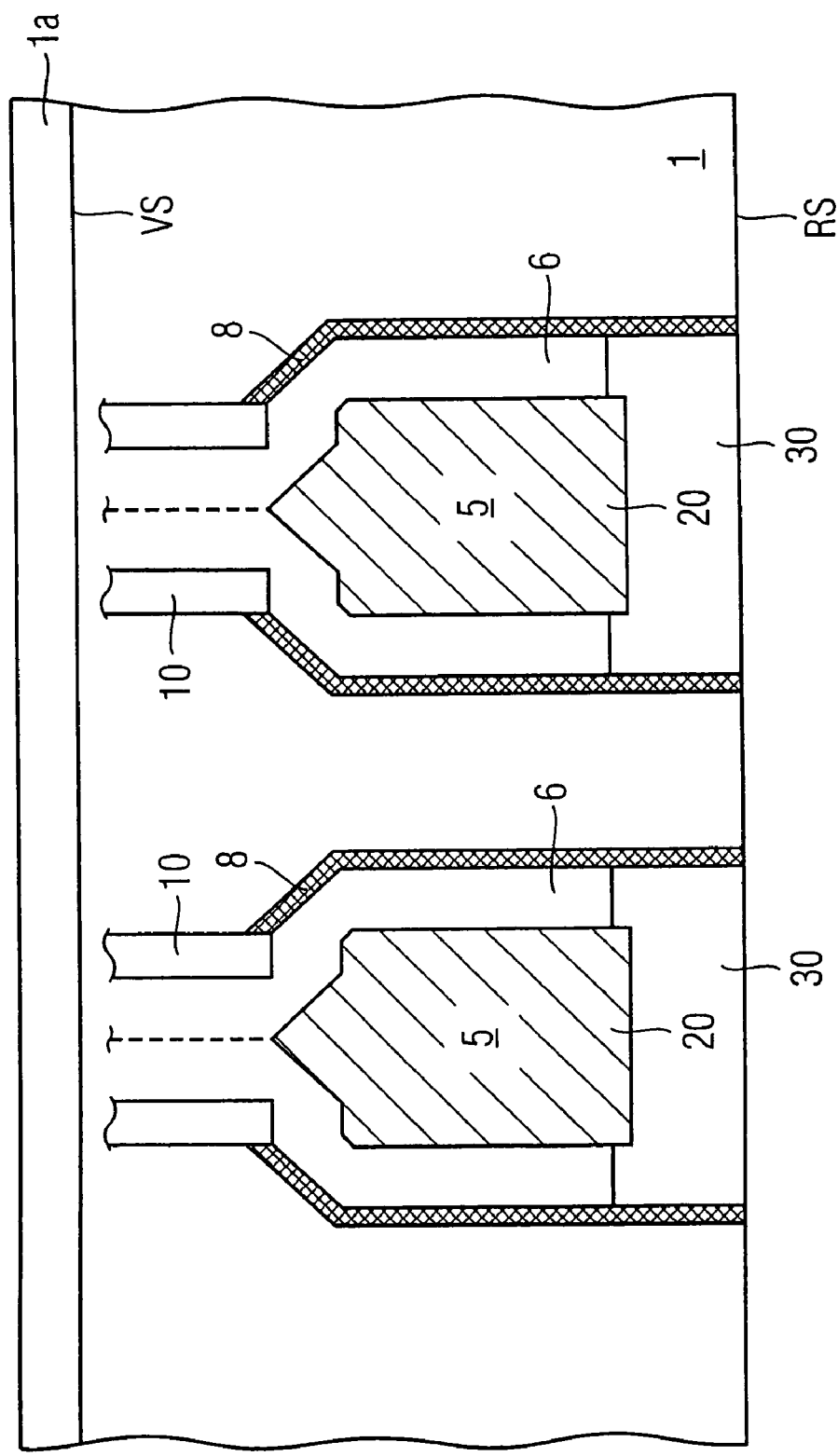

As illustrated in FIG. 1F, a second filling layer 30, for example made of silicon dioxide or silicate glass or a low-k material, such as e.g. Silk, is then provided on the rear side RS of the semiconductor substrate 1 and caused to recede and planarized until the rear side RS of the semiconductor substrate 1 is uncovered between the trenches 5.

Figure 1G:
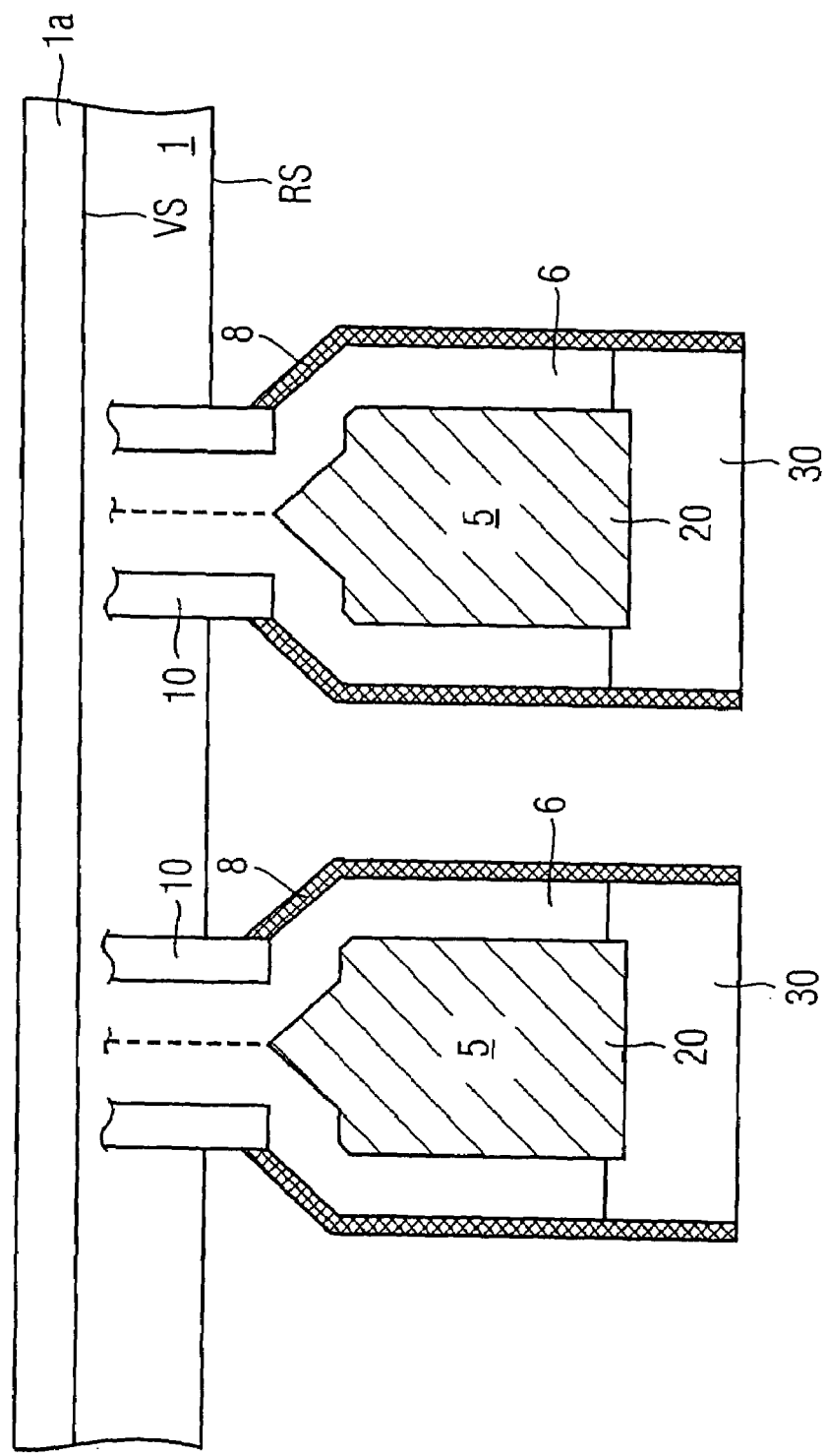

In the next process step illustrated in FIG. 1G, the semiconductor substrate 1 is removed selectively with respect to the second filling layer 30 and the etching stop layer 8 as far as toward the upper trench region, to be precise in the present case up to the level of the insulation collar 10, which is likewise composed of silicon oxide.

Figure 1H:
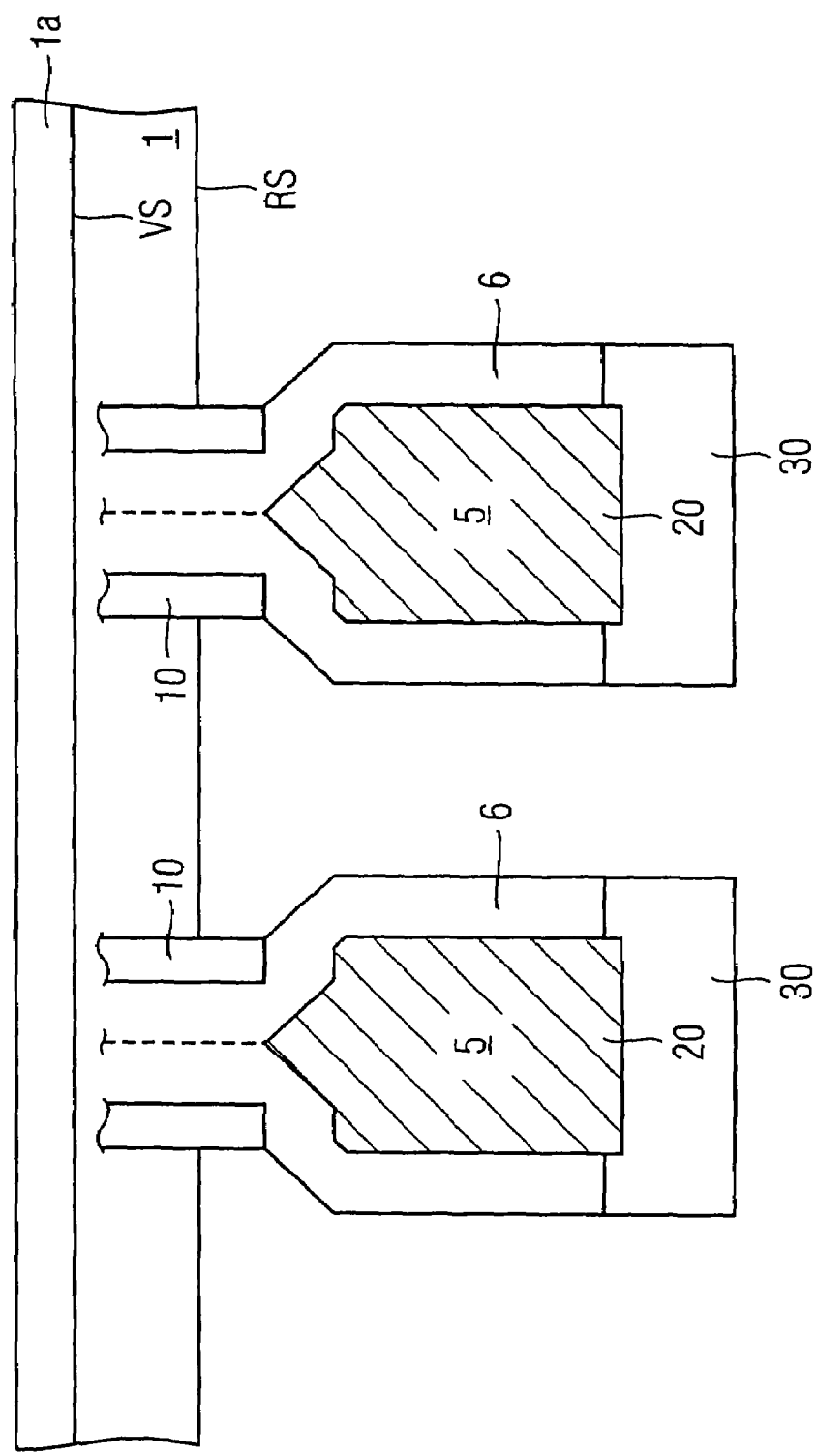
Figure 1I:
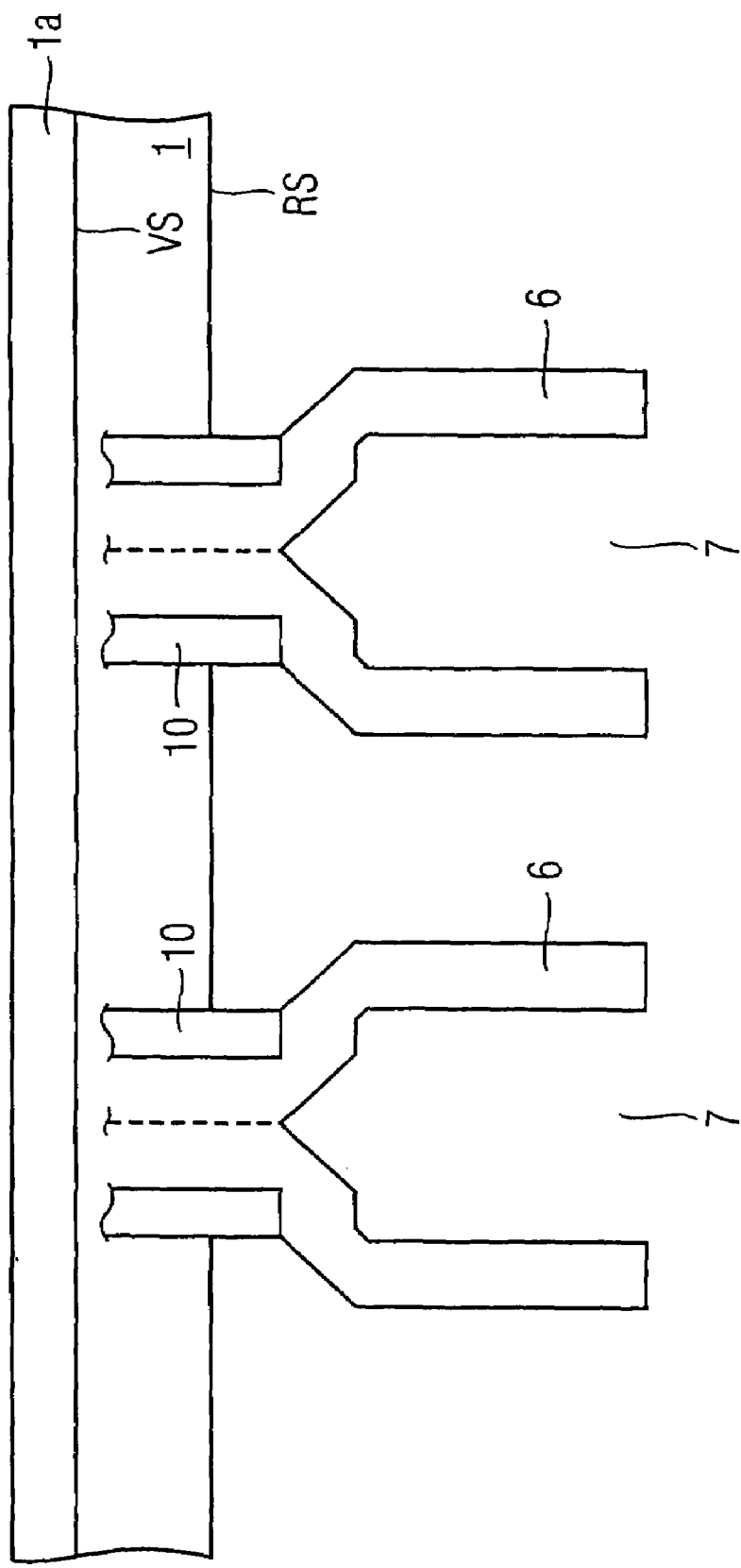

Afterward, in accordance with FIG. 1H, the etching stop layer 8 is removed by means of a selective etching process, after which, in accordance with FIG. 1I, the first and second filling layers 20 are also removed by means of a selective etching process in order thus to uncover the inner capacitor electrodes 6.

In accordance with FIG. 1J, a capacitor dielectric layer 40 is then deposited over the rear side RS.

Figure 1K:
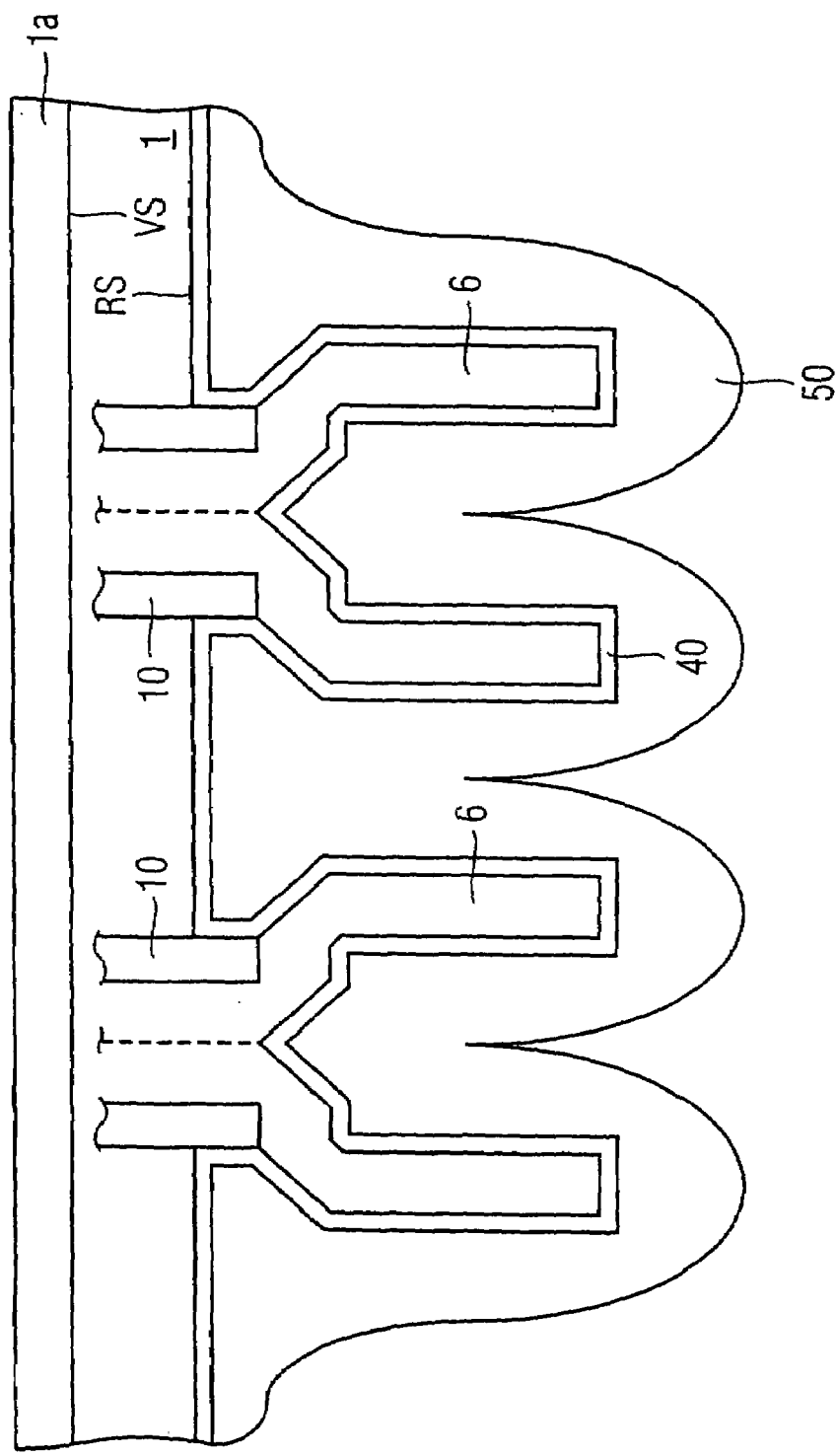

Finally, referring to FIG. 1K, the inner electrodes 6 with the dielectric layer 40 are coated with a conductive layer 50, which forms the second electrodes over the inner electrodes.

The layer for the second capacitor electrodes 50 may, as shown, either completely embed the inner capacitor electrodes 6 with the dielectric layer 40 or may be deposited conformally, so that the rear side has a relief. The former solution is more advantageous, however, with regard to the later handling of the semiconductor substrate 1.

FIG. 2 shows a schematic illustration of a method stage of a fabrication method for a semiconductor structure as a second embodiment of the present invention.

In the case of the second embodiment shown in FIG. 2, the semiconductor substrate 1 is not removed as far as the level of the insulation collar 10 on the rear side RS, but rather only as far as a region of the trench 5 which lies below the insulation collar 10. The insulation collar 10 made of silicon oxide is protected in this way and is not attacked during later etchings.

However, in the case of the second embodiment, care must be taken to ensure that the etching stop layer 8 that remains in the shoulder region of the trench has a sufficient thickness in order that a capacitive coupling to the remaining part of the semiconductor substrate 1 can be avoided. In the case of the second embodiment shown in FIG. 2, the semiconductor substrate 1 is not removed as far as the level of the insulation collar 10 on the rear side RS, but rather only as far as a region of the trench 5 which lies below the insulation collar 10. The insulation collar 10 made of silicon oxide is protected in this way and is not attacked during later etchings. However, care must be taken to ensure that the etching stop layer 8 that remains in the shoulder region of the trench has a sufficient thickness in order that a capacitive coupling to the remaining part of the semiconductor substrate 1 can be avoided.

FIGS. 3A-F show schematic illustrations of successive method stages of a fabrication method for a semiconductor structure as a third embodiment of the present invention.

Figure 3A:
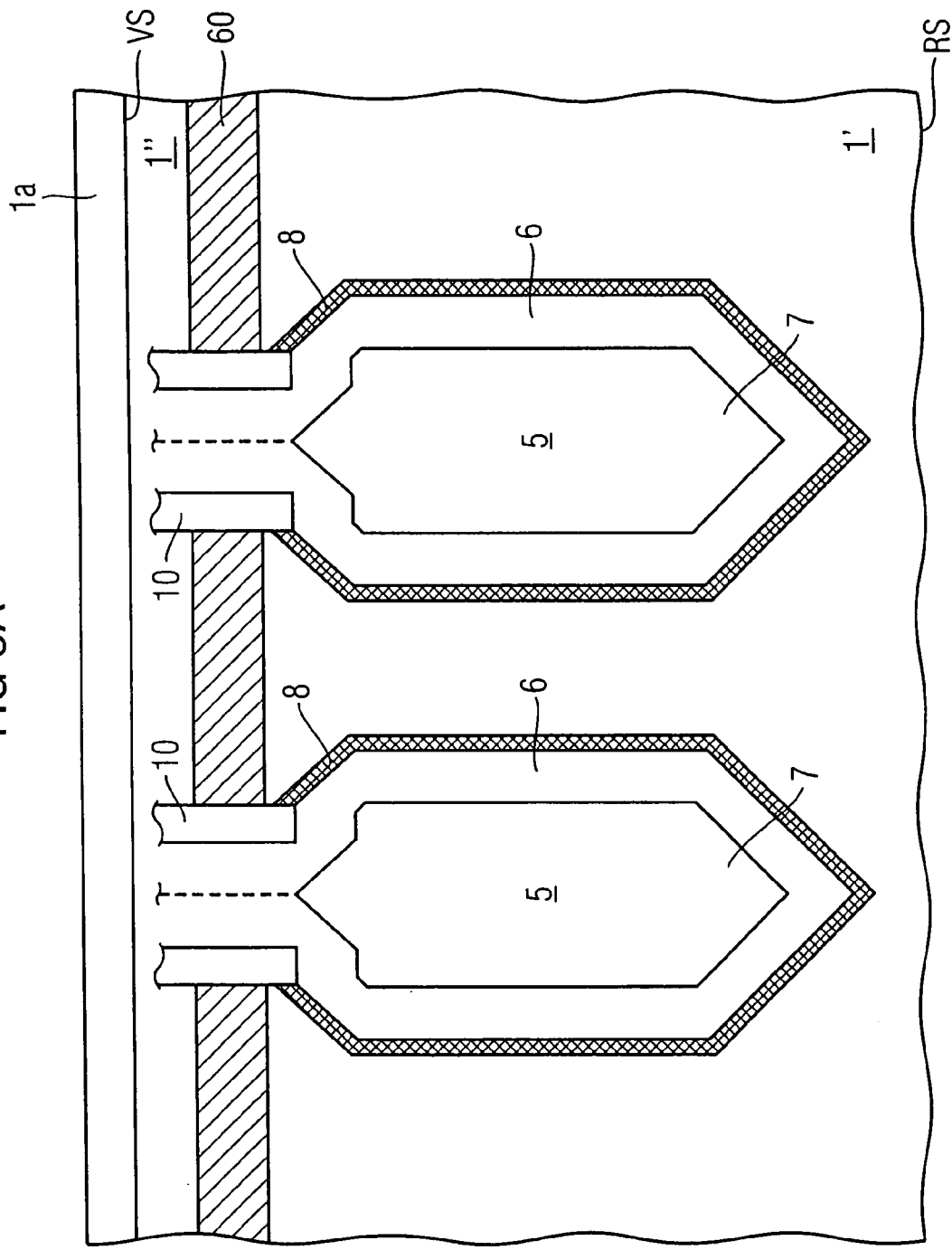

In accordance with FIG. 3A, the semiconductor substrate comprises a rear-side silicon substrate layer 1', a front-side silicon substrate layer 1" and an intervening insulation layer 60, e.g. made of $SiO_2$, which lies at the level of the insulation collars 10. By way of example, a substrate of this type is available as an SOI wafer (silicon-on-insulator).

Otherwise, the process state shown in FIG. 3A corresponds to the process state in accordance with FIG. 1A.

Referring further to FIG. 3B, the rear-side silicon substrate layer 1' is then removed as far as the insulation layer 60 by means of an etching process, the insulation layer 60 serving as an etching stop. In this case, as in the previous embodiments, the inner electrodes are protected by the etching stop layer 8 made e.g. of silicon nitride. The insulation collar 10 made of $SiO_2$ is likewise not attacked during this silicon etching.

On account of the fact that the silicon etching stops on the insulation layer 60, it is possible to compensate for severe etching inhomogeneities across the entire semiconductor substrate.

Referring to FIG. 3C, in this exemplary embodiment, in accordance with the later choice of a filling layer, the etching stop layer 8 is then extended to the regions of the uncovered insulation layer 60 and of the insulation collar 10, e.g. by means of a deposition process.

As illustrated in FIG. 3D, a filling layer 70, for example made of silicon oxide or silicate glass or a low-k material, such as e.g. Silk, is then provided on the rear side and completely embeds the trenches with the inner electrodes 6.

Referring further to FIG. 3E, the filling layer 70 is withdrawn to above the bottom of the trench, to be precise approximately to a level where the trench 5 has reached its maximum width.

In a subsequent process step illustrated in FIG. 3F, a chemical mechanical polishing back or other planarization or etching back is then effected for the purpose of removing the etching stop layer 8 and the lower part of the inner capacitor electrodes 6, thereby uncovering the cavity within the inner capacitor electrodes 6. Further process steps (not illustrated here) then involve removing the filling layer 70 and the etching stop layer 8 by means of a respective selective etching process. This is followed by the process steps for providing the dielectric layer and the outer capacitor electrodes, as already described above with reference to FIGS. 1J and 1K.

FIGS. 4A-D show schematic illustrations of successive method stages of a fabrication method for a semiconductor structure as a fourth embodiment of the present invention.

The process state shown in FIG. 4A corresponds to the process state in accordance with FIG. 3B directly after the removal of the rear-side silicon substrate layer 1'.

In this embodiment, the bottom electrodes 6 are not opened at the bottom side, rather this process step is followed directly by removal of the etching stop layer 8 in the process step shown in FIG. 4B. Afterward, the dielectric layer 40 is deposited over the resulting structure in accordance with FIG. 4C and the conductive layer 50 for the outer capacitor electrodes is then deposited in accordance with FIG. 4D.

This fourth embodiment is particularly simple from the standpoint of the process implementation. In this case, the bottom electrode may be formed as a solid body or a hollow body.

Figure 5A:
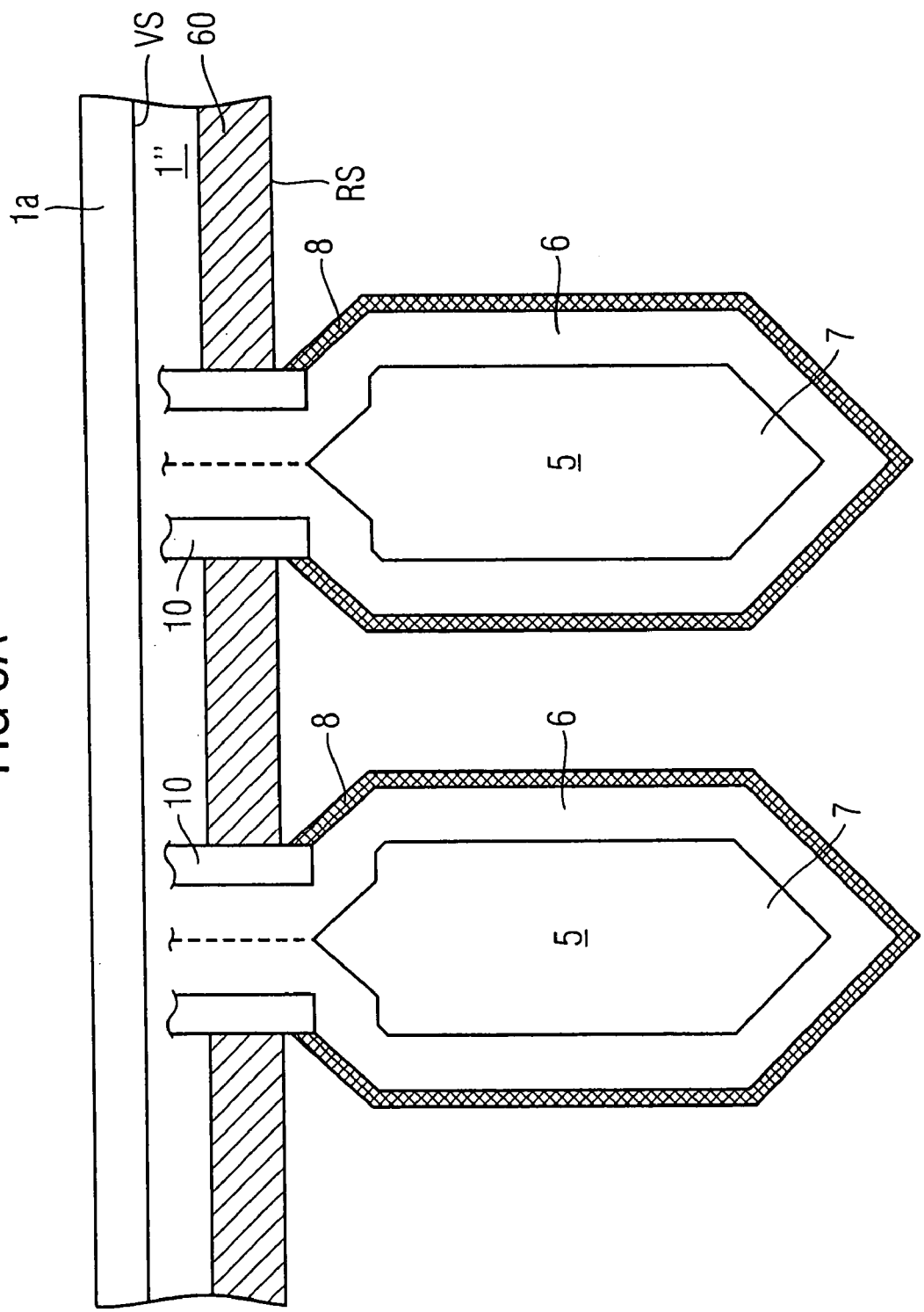
FIGS. 5A, B show schematic illustrations of successive method stages of a fabrication method for a semiconductor structure as a fifth embodiment of the present invention.

FIGS. 5A, B show schematic illustrations of successive method stages of a fabrication method for a semiconductor structure as a fifth embodiment of the present invention.

The process state shown in FIG. 5A again corresponds to the process state in accordance with FIG. 4A.

In the case of this embodiment, it is not necessary to extend the etching stop layer 8 to the uncovered regions of the insulation layer 60 and of the insulation collar 10 since the rear-side filling layer, which is designated by reference symbol 70 and is applied in accordance with FIG. 5, can later be removed selectively with respect to the etching stop layer 8 and the insulation layer 60 since it is composed for example of Silk or amorphous carbon.

Figure 5B:
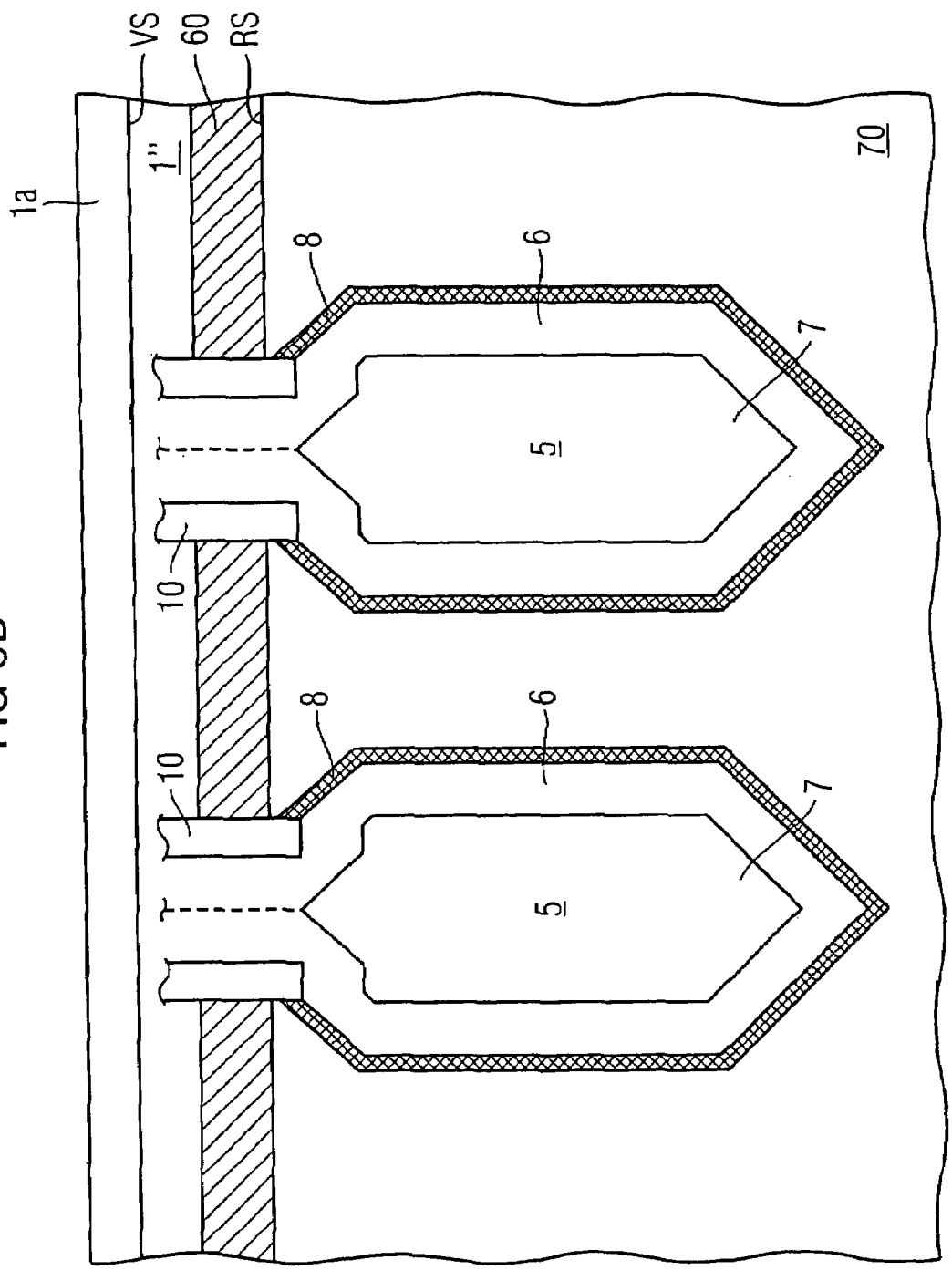

The process steps following FIG. 5B correspond to the process steps following in accordance with FIG. 3E.

FIGS. 6A-D show schematic illustrations of successive method stages of a fabrication method for a semiconductor structure as a sixth embodiment of the present invention.

In the case of the sixth embodiment, the inner capacitor electrodes 5 are not provided as a conformal layer on the trench walls of the trenches 5, but rather fill the trenches 5 completely, as shown in FIG. 6A. It should be mentioned in this case that other trench geometries such as e.g. a cylindrical form without expansion are also generally possible in all the embodiments.

In accordance with FIG. 6B, then first of all an etching process is effected for the purpose of removing a part of the semiconductor substrate 1 on the rear side RS and then a planarization step, such as e.g. a chemical mechanical polishing step or an etching back step, is effected for the purpose of removing the etching stop layer and for the purpose of removing a part of the inner electrodes 6, which leads to the process state shown in FIG. 6B.

Figure 6C:
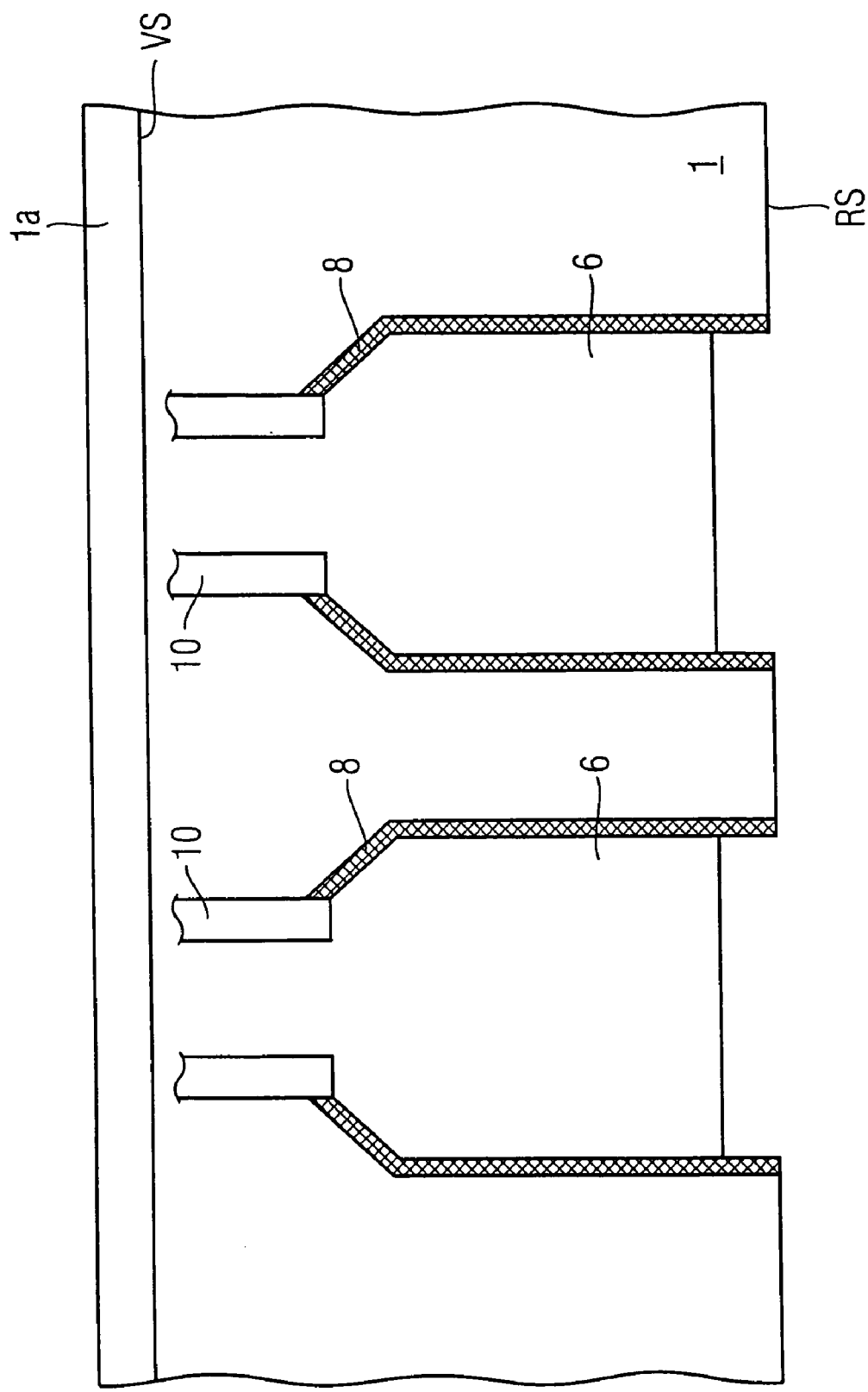

In a subsequent process step illustrated in FIG. 6C, the inner capacitor electrodes 6 are then sunk by means of an etching process with respect to the rear side RS.

Afterward, a filling layer 30A made e.g. of silicon oxide is provided over the rear side RS and polished back, so that the process state shown in FIG. 6D is obtained.

The process steps following FIG. 6D correspond to the process steps in accordance with FIGS. 1H to 1K.

FIGS. 7A, B show schematic illustrations of successive method stages of a fabrication method for a semiconductor structure as a seventh embodiment of the present invention.

The seventh embodiment proceeds from a process state in accordance with FIG. 7A that corresponds to the process state in accordance with FIG. 4B apart from the fact that the inner capacitor electrodes 6 are provided as a complete trench filling 5.

The subsequent process steps, leading to the final state shown in FIG. 7B, correspond to the process steps that have already been explained in connection with the fourth embodiment.

Although the present invention has been described above on the basis of a preferred exemplary embodiment, it is not restricted thereto, but rather can be modified in diverse ways.

In particular, the invention can be employed in principle for arbitrary trench structures.

Moreover, the trench geometry is only chosen by way of example, and arbitrary geometries are conceivable in principle.

In particular, it should be mentioned that the electrode materials and filling materials specified above are only by way of example and may be replaced by corresponding different materials having the same properties.

What is claimed is:

1. Fabrication method for a semiconductor structure having integrated capacitors, having the steps of:
    (a) providing a semiconductor substrate having a front side and a rear side;
    (b) providing trenches in the semiconductor substrate proceeding from the front side of the semiconductor substrate;
    (c) providing a respective inner capacitor electrode in the trenches;
    (d) uncovering the inner capacitor electrodes proceeding from the rear side of the semiconductor substrate;
    (e) providing a capacitor dielectric on the uncovered inner capacitor electrodes; and
    (f) providing outer capacitor electrodes on the capacitor dielectric on the inner capacitor electrodes.

2. Method according to claim 1, wherein the inner capacitor electrodes cover the respective trench on the trench walls and leave a cavity in the trench.

3. Method according to claim 2, wherein the following steps are performed for uncovering the inner capacitor electrodes:
    (a) providing an etching stop layer on the trench walls under the inner capacitor electrodes;
    (b) removing the semiconductor substrate, the etching stop layer and the inner capacitor electrodes on the rear side for the purpose of opening the cavity;
    (c) providing a first filling layer in the cavity;
    (d) sinking the first filling layer and the respective inner capacitor electrode in the cavity;
    (e) providing a second filling layer on the rear side, which plugs the trenches;
    (f) removing the second filling layer for the purpose of the semiconductor substrate on the rear side between the trenches;
    (g) removing selectively the semiconductor substrate on the rear side as far as the upper trench region with respect to the etching stop layer and the second filling layer; and
    (h) removing the etching stop layer and the first and second filling layers.

4. Method according to claim 2 wherein the following steps are performed for uncovering the inner capacitor electrodes:
    (a) providing an etching stop layer on the trench walls under the inner capacitor electrodes;
    (b) removing selectively the semiconductor substrate on the rear side as far as the upper trench region with respect to the etching stop layer;
    (c) providing a third filling layer for embedding the trenches;
    (d) removing the third filling layer, the etching stop layer and the inner capacitor electrodes on the rear side for the purpose of opening the cavity; and
    (e) removing the etching stop layer and the third filling layer.

5. Method according to claim 2 wherein the following steps are performed for uncovering the inner capacitor electrodes:
    (a) providing an etching stop layer on the trench walls under the inner capacitor electrodes;
    (b) removing selectively the semiconductor substrate on the rear side as far as the upper trench region with respect to the etching stop layer; and
    (c) removing the etching stop layer.

6. Method according to claim 1, wherein the semiconductor substrate has a rear-side first substrate layer, a front-side second substrate layer and a middle insulation layer, the middle insulation layer functioning as an etching stop in the course of uncovering the inner capacitor electrodes.

7. Method according to claim 1, wherein the inner capacitor electrodes fill the respective trench.

8. Method according to claim 5, wherein the following steps are performed for uncovering the inner capacitor electrodes:
    (a) providing an etching stop layer on the trench walls under the inner capacitor electrodes;
    (b) removing the semiconductor substrate, the etching stop layer and the inner capacitor electrodes on the rear side for the purpose of opening the filled trenches;
    (c) sinking the inner capacitor electrodes;
    (d) providing a fourth filling layer on the rear side, which plugs the trenches;
    (e) removing selectively the semiconductor substrate on the rear side as far as the upper trench region with respect to the etching stop layer; and
    (f) removing the etching stop layer.

9. Method according to claim 1, wherein the trenches are widened in bottle-shaped fashion in the lower trench region.

10. Method according to claim 1, wherein the outer capacitor electrodes are provided from a whole-area conductive layer on the rear side.

* * * * *